United States Patent
Nishihara et al.

(10) Patent No.: US 7,622,982 B2
(45) Date of Patent: Nov. 24, 2009

(54) ELECTRICAL FUSE DEVICE

(75) Inventors: Ryuji Nishihara, Osaka (JP); Yasuhiro Agata, Osaka (JP); Toshiaki Kawasaki, Osaka (JP); Shinichi Sumi, Osaka (JP)

(73) Assignee: Panasonic Corporation, Osaka (JP)

( * ) Notice: Subject to any disclaimer, the term of this patent is extended or adjusted under 35 U.S.C. 154(b) by 63 days.

(21) Appl. No.: 11/882,974

(22) Filed: Aug. 8, 2007

(65) Prior Publication Data

US 2008/0036527 A1 Feb. 14, 2008

(30) Foreign Application Priority Data

Aug. 9, 2006 (JP) ............................. 2006-216632

(51) Int. Cl.
*H01H 37/76* (2006.01)

(52) U.S. Cl. .................... 327/525; 327/526; 365/225.7; 365/96

(58) Field of Classification Search ................. 327/525, 327/526; 365/225.7, 96
See application file for complete search history.

(56) References Cited

U.S. PATENT DOCUMENTS

| | | | |
|---|---|---|---|
| 6,333,878 B2 | 12/2001 | Ooishi | |
| 7,031,218 B2 | 4/2006 | Hoffmann et al. | |
| 7,254,079 B2* | 8/2007 | Sumi et al. | 365/225.7 |
| 7,397,720 B2* | 7/2008 | Sumi et al. | 365/225.7 |
| 7,426,254 B2* | 9/2008 | Kim | 365/225.7 |
| 2004/0080357 A1* | 4/2004 | Chuang et al. | 327/525 |
| 2006/0158920 A1* | 7/2006 | Sumi et al. | 365/96 |

FOREIGN PATENT DOCUMENTS

WO   WO 97/12401   4/1997

* cited by examiner

*Primary Examiner*—Long Nguyen
(74) *Attorney, Agent, or Firm*—McDermott Will & Emery LLP

(57) ABSTRACT

The invention provides an electrical fuse device comprising: a plurality of fuse cores, each having an electrical fuse element and a switching element serially connected to the electrical fuse element; a program control circuit generating a program shift signal by sequentially shifting a program control transmission signal in synchronization with an effective program clock signal and subsequently generating a program signal to be sent to each of the switching elements in the plurality of fuse cores based on program data and the program shift signal; and a program clock control circuit controlling the conducting and non-conducting states of a program clock signal in accordance with a program clock enable signal and, when the program clock signal is in a conducting state, transmitting the program clock signal to the program control circuit as the effective program clock signal.

2 Claims, 17 Drawing Sheets

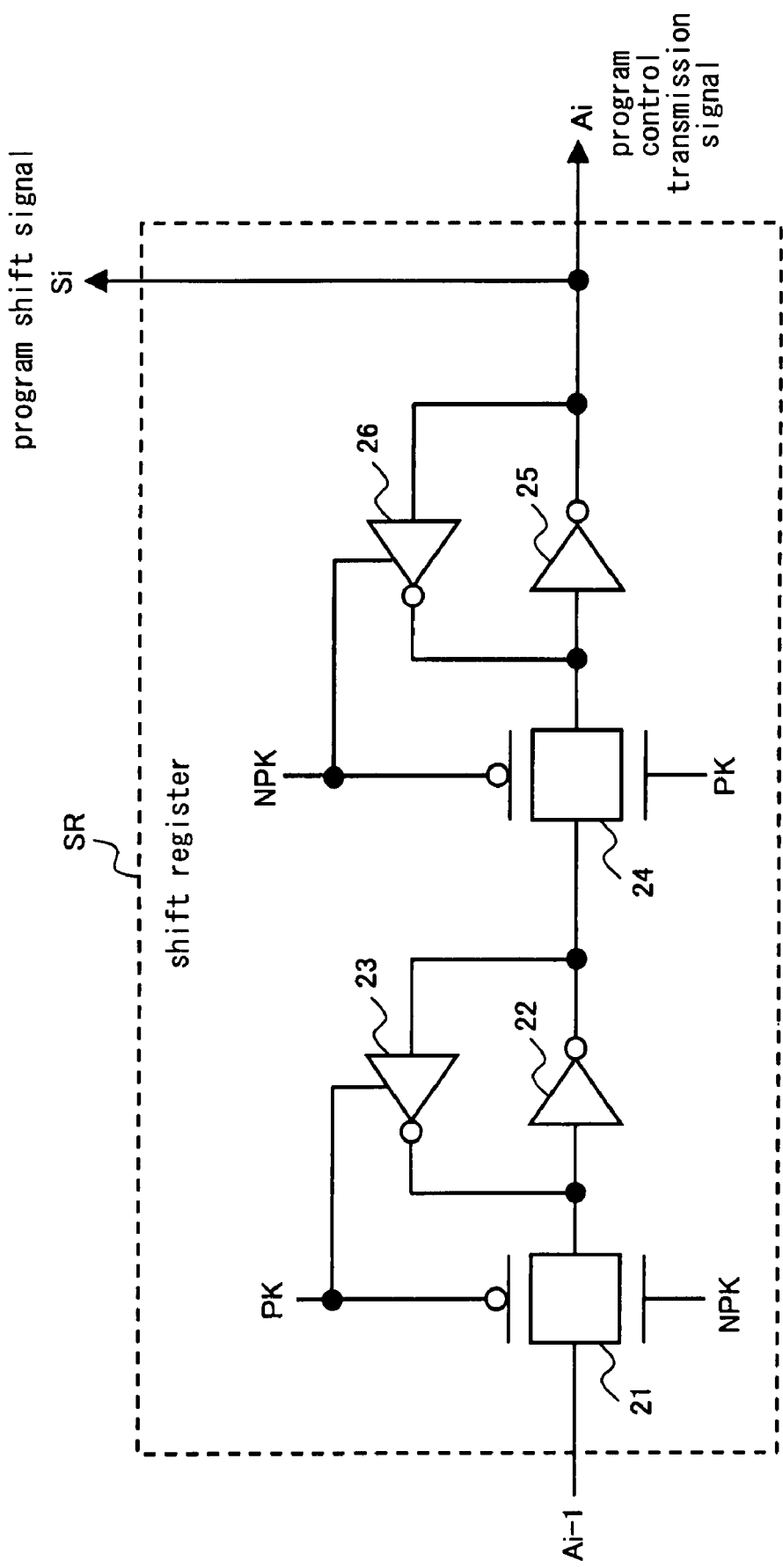
F I G. 2

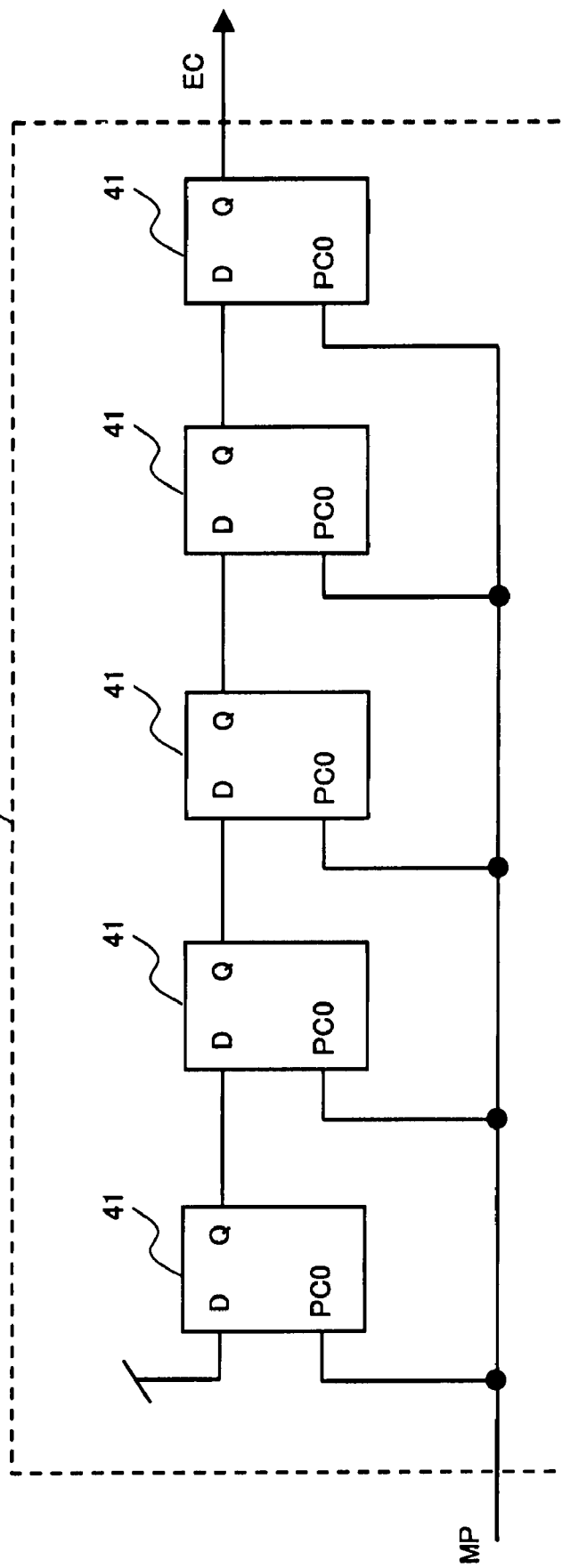
F I G. 5

FIG. 11

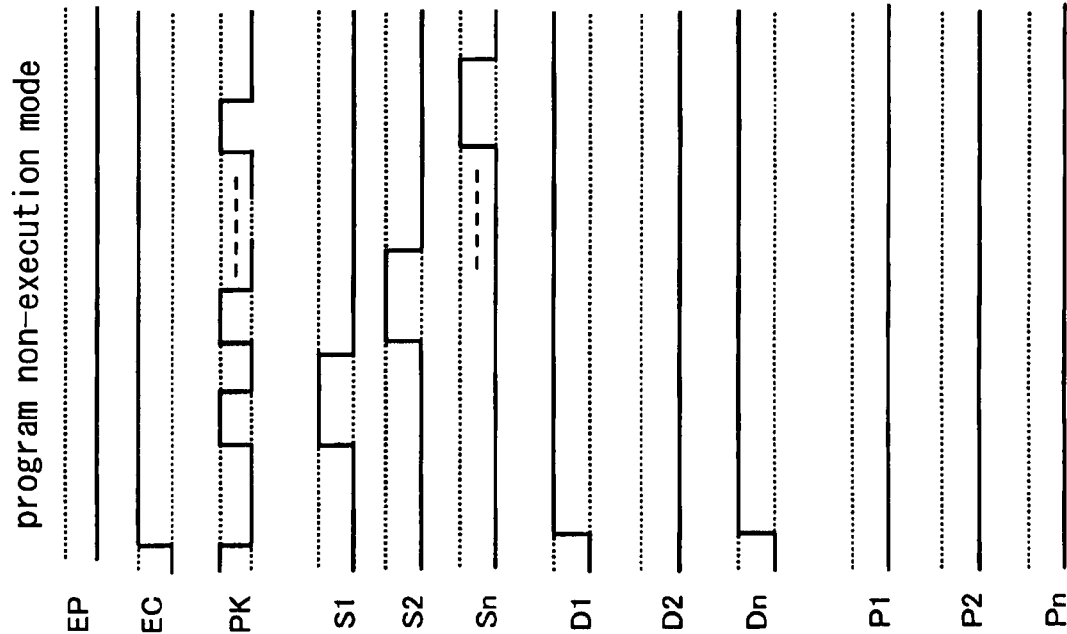
FIG. 12B  program non-execution mode
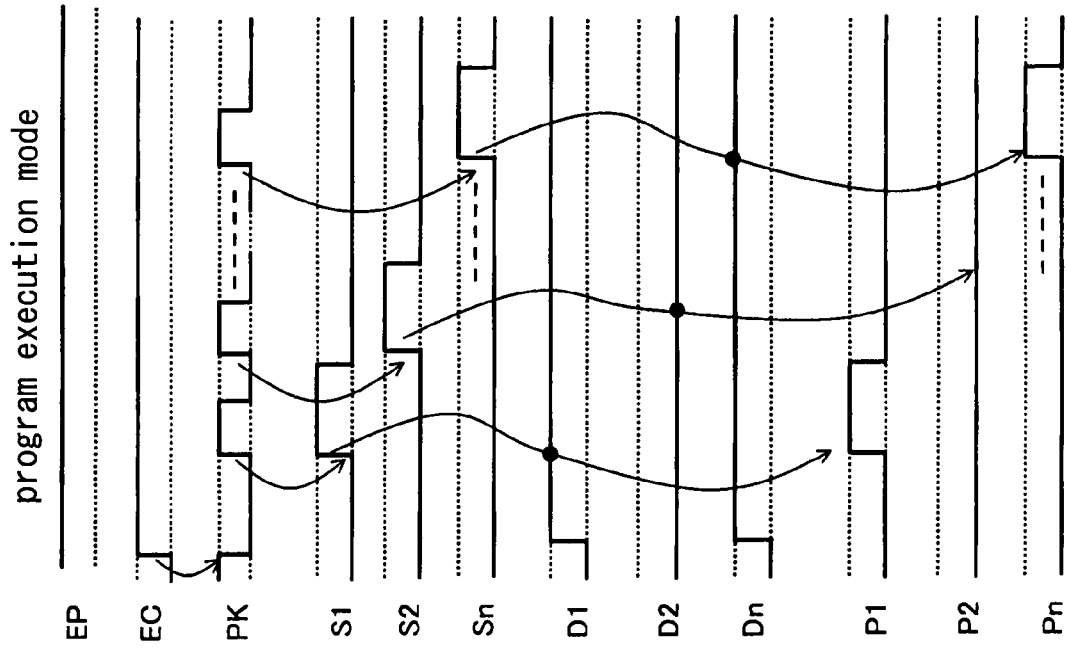
FIG. 12A  program execution mode F I G. 1 4
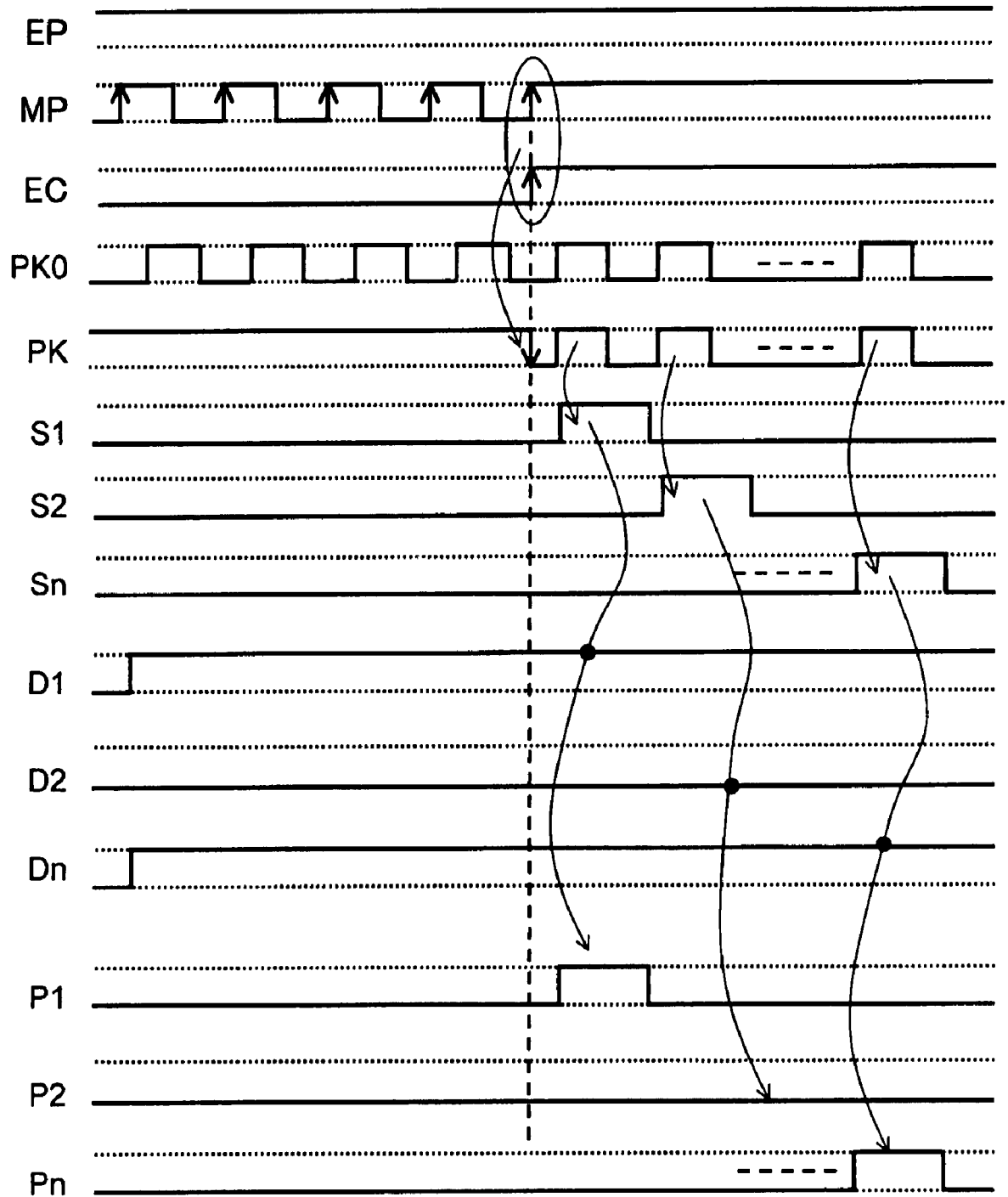

ELECTRICAL FUSE DEVICE

BACKGROUND OF THE INVENTION

1. Field of the Invention

The present invention relates to electrical fuse devices each comprising a plurality of stages of fuse cores, each fuse core having an electrical fuse element and a switching element, serially connected together, wherein programs are executed on each electrical fuse element by sequentially providing program data to each switching element, in synchronization with a program clock signal.

2. Description of the Related Art

Electrical fuse devices are widely used for integrated circuits (LSIs) including program devices for high frequency trimming. An electrical fuse device comprises electrical fuse elements made of materials such as poly-silicon. An electrical fuse element is serially connected to a bipolar transistor, in which a process, such as "blowing" and "silicidization", is carried out by allowing a relatively large electrical current of about 1 ampere to flow through the bipolar transistor. Such a process, carried out on electrical fuses, is hereinafter denoted as "the electrical fuse element program" and the act of carrying out such processes is hereinafter denoted as "execution of the program" or "executing (to execute) the program".

Recently, in the field of semiconductor integrated circuits, a process of depositing silicidized metallic materials onto polysilicon has been developed as a way to form gate materials, in order to reduce electrical resistivities of the gate materials. There has also been developed a technology for electrical fuse elements, which exploits the mechanism of increasing electrical resistivities by blowing the top surface silicide layer with an electrical current flowing through the gate materials, formed in the manner described above, of semiconductor integrated circuits. In the 130 nm and 90 nm process generations of semiconductor integrated circuits, instantaneous electrical current required for executing the program on a fuse element by electrical conduction, is in the range of 10 to 30 milliamperes for each fuse element.

FIG. 17 shows a circuit diagram of an electrical fuse device conventionally used for semiconductor integrated circuits. In FIG. 17, the reference symbol F denotes an electrical fuse element, the reference symbol Q denotes a switching element comprising a PMOS transistor, serially connected to the electrical fuse element F, and the reference numeral 61 is a NAND gate of which output is connected to the gate of the switching element Q.

For a selected electrical fuse element F, in case that the NAND gate 61 is set to a conducting state by an input of a program signal to the NAND gate 61, the conducting NAND gate 61 turns on the switching element Q, allowing electrical current to flow through the electrical fuse element F. The electrical fuse element F is in the form of a micropattern comprising silicides, polysilicon, or metals, and is programmed to be blown, or to increase its electrical resistivity, when a preset current flows through. An electrical fuse element F, in the above configuration, enables recognition of 0/1 signal states, through reading of resistivity of the initial state when the program is not executed and its high resistivity of the state after the program is executed. (Refer, for example, to National Publication of International Paten Application (kohhyou) Hei 11-512879) In the electrical fuse device, a program clock signal is input externally to the shift registers connected to a plurality of fuse cores, and the switching elements, which are serially connected, bring the fuse elements into conduction sequentially, based on the program signal and program data provided by the shift registers.

In conventional configurations, however, when pulses, under the influence of noise, surge or the like, are generated on a program clock terminal, which is devised to input a program clock signal, the fuse element program may possibly be executed, in an unexpected manner, during a program non-execution mode. Once the fuse element program is executed, the electrical fuse element is electrically (physically) blown due to conduction, making the electrical fuse element unrepairable, and the damage becomes fatal.

SUMMARY OF THE INVENTION

The main object of the present invention, therefore, is to provide an electrical fuse device having a high durability against noise and surge.

An electrical fuse device according to the present invention comprises;

a plurality of fuse cores, each having an electrical fuse element and a switching element serially connected to the electrical fuse element;

a program control circuit generating a program shift signal by sequentially shifting a program control transmission signal in synchronization with an effective program clock signal and subsequently generating a program signal to be sent to each of the switching elements in the plurality of fuse cores based on program data and the program shift signal; and a program clock control circuit controlling the conducting and non-conducting states of a program clock signal in accordance with a program clock enable signal and, when the program clock signal is in a conducting state, transmitting the program clock signal to the program control circuit as the effective program clock signal.

In this configuration, in a program execution mode, a program clock enable signal is asserted, whereby a program clock signal is caused to pass through a program clock control circuit and the program clock signal which has passed through is provided to a program control circuit as an effective program clock signal.

In the program control circuit, program data corresponding to a plurality of fuse cores is set and a program control signal is input. Then, the program control circuit asserts the program data for the electrical fuse elements on which the program is to be executed and negates the program data for the electrical fuse elements on which the program is not to be executed. In the program control circuit, the effective program clock signal generates program shift signals, each of which corresponds to a fuse core, by sequentially shifting the program control signal as the program control transmission signal. Then the program data is caused to pass through a gate as a program signal by the program shift signal and is provided to each switching element of the fuse cores. The switching element, corresponding to each of the electrical fuse elements on which the program is to be executed, is brought into a conducting state by the program signal, an electrical current flows through the electrical fuse element on which the program is to be executed, and thus the electrical fuse element program (blowing, or increasing resistivity) is executed. At that time, the switching elements corresponding to the electrical fuse elements on which the program is not to be executed, remain in the non-conducting state and thus the program is not executed.

On the other hand, in a program non-execution mode, the program clock enable signal is negated to disable the program clock control circuit. This negates the effective program clock signal which is provided to the program control circuit from the program clock control circuit. Once the effective program clock signal is negated, the program control circuit itself becomes disabled, all the program shift signals and program signals being negated, so that no electrical current flows through any of the switching elements of the plurality of fuse cores.

As described above, the program clock control circuit is added, whereby the transfer of the effective program clock signal to the program control circuit is controlled by the program clock enable signal. Even in case that pulses, under the influence of noise, surge or the like, are generated on the program clock terminal during a program non-execution mode, no program is executed on the electrical fuse elements on which the program is not to be executed, because the effective program clock signal is negated. As a result, erroneous executions of the program are prevented in a reliable manner.

In one aspect, the electrical fuse device with the above configuration may further comprise; a counter circuit, disposed in a stage before the program clock control circuit, counting the number of input pulses of a program mode switching pattern signal, asserting and outputting the program clock enable signal to the program clock control circuit when the number of the input pulses counted reaches a preset value.

In this configuration, the counter circuit, disposed in a stage before the program clock control circuit, counts the number of input pulses, wherein the counter circuit asserts the program clock enable signal, only when the input signal is a program mode switching pattern signal having a preset signal pattern and the number of pulses counted reaches a preset value, and outputs the signal to the program clock control circuit. This leads to a program execution mode. In the program execution mode, the program mode switching pattern signal, having a preset number of or more pulses, is input into the counter circuit. On the other hand, in a program non-execution mode, no program mode switching pattern signal having a preset signal pattern is input into the counter circuit. In this configuration, assertion occurs only when the number of the input pulses counted of the program mode switching pattern signal reaches a preset value. Therefore, even though the program clock enable signal is asserted, this configuration significantly reduces the probability of asserting the program clock enable signal, compared to other configurations which assert the signal immediately. As a result, the effects of noise, surge or the like, imposed on the program clock terminal and the program clock enable terminal, are eliminated more effectively and erroneous execution of the program on the electrical fuse elements is prevented in a more reliable manner.

In one aspect, the program clock control circuit of the electrical fuse device with the above configuration; may also be configured to use the output from the electrical fuse element in the final stage of the fuse cores as the program clock enable signal.

In this configuration, the program clock signal is controlled by using the output from the electrical fuse element of the fuse core in the final stage, as a program clock enable signal, and the outputs of the electrical fuse elements are negated by executing the program on the fuse element in the final stage, after the program is executed on desired fuse elements, other than the one in the final stage, and, consequently, the program clock enable signal is negated and, thus, the program clock signal is logically blocked completely. As a result, even when an erroneous shift to a program execution mode occurs after execution of the program, unexpected execution of the electrical fuse element program is prevented. In addition, the circuit configuration is simplified, because the need for a program clock enable terminal which inputs the program clock enable signal externally is eliminated.

The above configurations are mainly based on the concept of controlling the effective program clock signal, input into the program control circuit which shifts program control transmission signals; however, the present invention may also be configured to control the program signals on the output side of the program control circuit. The following explains this aspect.

An electrical fuse device according to the present invention comprises;

a plurality of fuse cores, each having an electrical fuse element and a switching element serially connected to the electrical fuse element;

a program control circuit generating a program shift signal by sequentially shifting a program control transmission signal in synchronization with an effective program clock signal and subsequently generating a program control signal based on program data and the program shift signal; and a program mode control circuit controlling the conducting and non-conducting states of the program control signal, in accordance with a program clock enable signal and, when the program control signal is in a conducting state, outputting the program control signal as a program signal to each of the switching elements in the plurality of fuse cores.

This configuration is featured by a program mode control circuit disposed in a stage after the program control circuit which shifts program control transmission signals.

In a program execution mode of this configuration, the program mode control circuit asserts a program enable signal and, thus, passes program control signals, from the program control circuit, through to corresponding switching elements of the fuse cores as program signals. This enables simultaneous execution of the program on all the fuse cores. In a program non-execution mode, on the other hand, all the program control signals from the program mode control circuit are negated by negating the program enable signal. Because all the program signals are negated, no current flows through any of the switching elements of the plurality of fuse cores and all the fuse cores are made into non-programmable condition simultaneously.

As described above, according to this aspect of the present invention, all the electrical fuse elements are switched between programmable and non-programmable conditions by one operation of the program enable signal. Therefore, by negating the program enable signal in a program non-execution mode, no program is executed erroneously on the electrical fuse elements on which the program is not to be executed, even in case that pulses, under the influence of noise, surge or the like, are generated on the program clock terminal. As a result, erroneous execution of the program is prevented in a secured manner.

In one aspect of the above electrical fuse device having a program mode control circuit, the electrical fuse device may further comprise;

a program clock control circuit controlling the conducting and non-conducting states of a program clock signal in accordance with a program clock enable signal and, when the program clock signal is in a conducting state, transmitting the program clock signal as the effective program clock signal to the program control circuit. This aspect comprises two erroneous program preventative measures, i.e., the program clock control circuit and program mode control circuit, which function as a dual system to prevent erroneous execution of the program.

In a program non-execution mode of this configuration, a program clock enable signal, which is asserted by an erroneous setting, is assumed to be input into the program control terminal of the program mode control circuit. Even in such a case, no erroneous execution of the electrical fuse program should occur, because the control is supported by the program clock control circuit disposed in a stage before the program control circuit and, consequently, reliability is further improved.

In one aspect of the above electrical fuse device comprising a program mode control circuit, the electrical fuse device may further comprise;

a counter circuit, disposed in a stage before the program clock control circuit, counting the number of input pulses of a program mode switching pattern signal and, when the number of the input pulses counted reaches a preset value, asserting and outputting the program clock enable signal to the program clock control circuit. This aspect comprises three erroneous program preventative measures, i.e., the program clock control circuit, program mode control circuit and counter circuit, which function as a triple system to prevent erroneous execution of the program.

In a program non-execution mode of this configuration, a program clock enable signal, which is fixed in an asserted state by an erroneous setting, is assumed to be input into the program control terminal of the program mode control circuit and, at the same time, the program clock terminal of the program clock control circuit is also assumed to be fixed to an asserted state by an erroneous setting. Even such a case occurs in this configuration, the program clock control circuit does not output any effective program clock signal, unless a program mode switching pattern signal, having a preset number of or more pulses, is input into the counter circuit. As a result, the electrical fuse program is not executed erroneously and the reliability is further improved.

In one aspect of the above electrical fuse device comprising a program mode control circuit, the program clock control circuit may;

use the output from the electrical fuse element of the fuse core in the final stage as the program clock enable signal.

According to this configuration, the need for program clock enable terminal which inputs the program clock enable signal externally is eliminated and the circuit configuration is simplified.

According to the present invention, even in case that pulses, under the influence of noise, surge or the like, are generated on external terminals and/or the terminal modes are erroneously set, the program of the electrical fuse element which is not to be executed is prevented in effective manners from being executed (blowing, or increasing resistivity) erroneously. Thus the present invention provides an electrical fuse device with excellent reliabilities.

The electrical fuse device of the present invention is advantageous for use in system LSIs requiring electrical fuse functions with high reliabilities.

BRIEF DESCRIPTION OF THE DRAWINGS

These and other objects of the present invention will become apparent from the following discussion of the preferred embodiments and will be clearly defined by the appended claims. Other numerous benefits and advantages, which will not be described herein, will become evident to those skilled in the art through exercising the present invention.

FIG. 2 is a circuit diagram showing a configuration of shift registers in the electrical fuse device according to the first embodiment;

FIG. 5 is a circuit diagram showing a configuration of a counter circuit in the electrical fuse device according to the second embodiment;

FIG. 11 is a circuit diagram showing a configuration of an electrical fuse device according to a fifth embodiment;

FIG. 12A and FIG. 12B are timing charts showing operations of the electrical fuse device according to the fifth embodiment;

FIG. 14 is a timing chart showing the operations of the electrical fuse device according to the sixth embodiment;

DETAILED DESCRIPTION OF THE INVENTION

The following concretely explains embodiments of electrical fuse devices according to the present invention with reference to drawings.

First Embodiment

Figure 1:
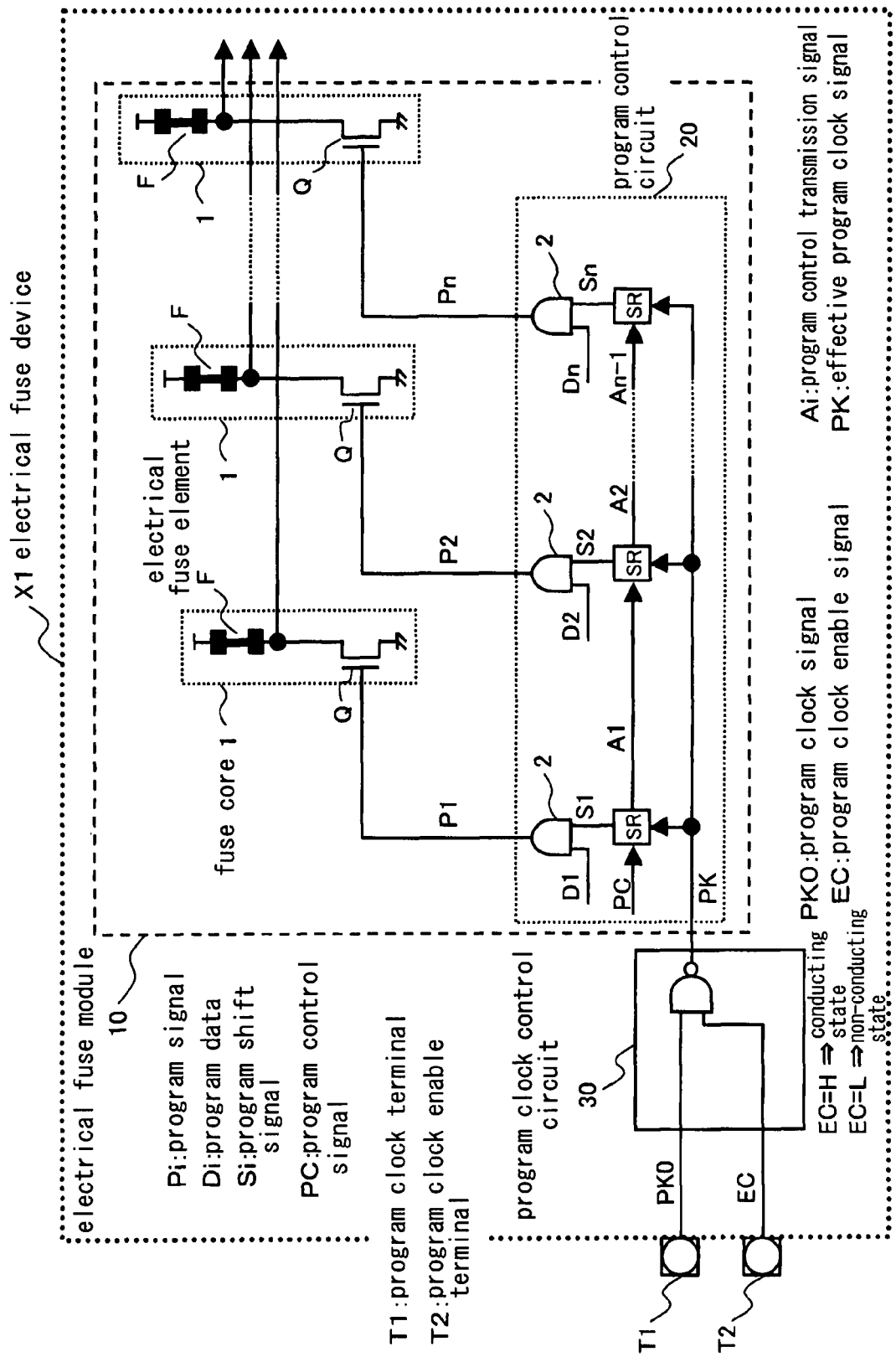
FIG. 1 is a circuit diagram showing a configuration of an electrical fuse device according to a first embodiment.

FIG. 1 is a circuit diagram showing a configuration of an electrical fuse device according to a first embodiment. In FIG. 1, the reference symbol X1 denotes an electrical fuse device, the reference numeral 10 an electrical fuse module, the reference numeral 20 a program control circuit and the reference numeral 30 a program clock control circuit. The reference symbol F denotes an electrical fuse element made of a silicide, polysilicon, or a metal, with its one end connected to an external power source terminal. The reference symbol Q is a switching element and the switching element Q comprises an NMOS transistor with its drain connected to the other end of the electrical fuse element F and its source connected to a grounding terminal. An electrical fuse element F and a switching element Q compose a fuse core 1. There are provided "n" stages of the fuse cores 1, wherein "n" is a natural number greater than or equal to 2.

The program control circuit 20 comprises n stages of units, each having a shift register SR and a two-input AND gate 2. Program data Di (i=1 to n) is input into one input terminal of each AND gate 2. Shift registers SR are provided for each of the stages, from the first to nth stage, composing a serially connected configuration, in which the output of a shift register is connected to the input of the shift register in the next stage. Once a program signal PC is input into the shift register SR in the first stage, program control transmission signals, A1 to An-1, are output from corresponding stages in synchronization with an effective program clock signal PK. The effective program clock signal PK is commonly input into all the shift registers SR from the first stage to the nth stage. In addition, program shift signals Si (i=1 to n), outputs from the shift registers SR, are respectively input into the AND gates 2, and program signals Pi (i=1 to n), outputs from the AND gates 2, are respectively input into the gates of the switching elements Q of the fuse cores 1.

As described, the program control circuit 20 generates the program shift signals Si, by sequentially shifting the program control transmission signals Ai (i=1 to n) in synchronization with the effective program clock signal PK, and generates and outputs the program signals Pi to each of the switching elements Q in the plurality of fuse cores 1 from the program data Di and program shift signals Si in the AND gates 2.

The reference symbol T1 is a program clock terminal disposed as an external terminal to which a program clock signal PK0 is input, whereas, the reference symbol T2 is a program clock enable terminal to which a program clock enable signal EC is input and which controls the program clock signal PK0. The program clock control circuit 30 controls the program clock signals PK0 being input, based on the program clock enable signal EC being input, and comprises a NAND gate.

The program clock control circuit 30 carries out the following control in a program execution mode:

asserting the program clock enable signal EC and passing the program clock signal PK0 through; and activating the program control circuit 20 by providing the clock signal PK0 as an effective program signal PK to the program control circuit 20.

On the other hand, in a program none-execution mode, the program clock control circuit 30 carries out the following control:

negating the program clock enable signal EC and blocking the supply of the program clock signal PK0 to the program control circuit 20; and negating the effective program signal PK and disabling the program control circuit 20.

The reason for controlling the program control circuit 20 to bring it a to disabled state, in a program non-execution mode, is to preclude the possibility that the effective program clock signal PK is asserted due to pulses, under the influence of noise, surge or the like, generated on the program clock terminal T1, and the program is thus erroneously executed on the fuse element F unexpectedly.

The program clock control circuit 30 controls the conducting and non-conducting states of the program clock signal PK through the program clock enable signal EC, and transmits the program clock signal PK in a conducting state, as the effective program clock signal PK, to the program control circuit 20.

The following explains a specific circuit configuration of the shift register SR in the $i^{th}$ stage of FIG. 1, with reference to FIG. 2. In FIG. 2, the reference numerals 21 and 24 are transmission gates, each comprising a PMOS transistor and an NMOS transistor connected in parallel, the reference numerals 22 and 25 are inverters and the reference numerals 23 and 26 are tri-state type inverters. The transmission gate 21, which receives the program control transmission signal Ai-1, or the output from the (i-1)$^{th}$ stage, receives the effective program clock signal PK on the gate of its PMOS transistor and the inversion signal NPK of the effective program clock signal PK on the gate of its NMOS transistor. In the transmission gate 24, the control inputs are reverse to the case of the transmission gate 21. The inverter 22 has its input connected to the output of the transmission gate 21 and its output connected to the input of the transmission gate 24. The tri-state type inverter 23, which is set to a conducting state when the effective program signal PK is asserted, is connected anti-parallel to the inverter 22. The inverter 25 has its input connected to the output of the transmission gate 24 and its output connected to the input of the shift register SR in the next stage. The tri-state type inverter 26, which is set to a conducting state when the inversion signal of the effective program signal NPK is asserted, is connected anti-parallel to the inverter 25. The output from the inverter 25 turns to the program control transmission signal Ai and program shift signal Si.

Figure 3B:
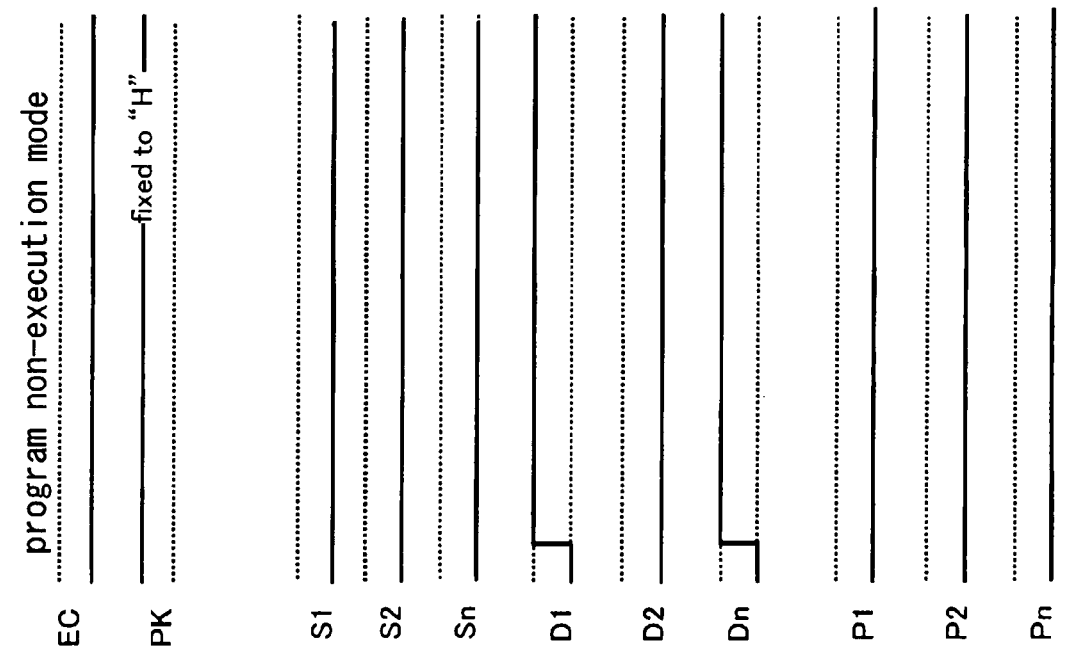
FIG. 3A and FIG. 3B are timing charts showing operations of the electrical fuse device according to the first embodiment.
Figure 3A:
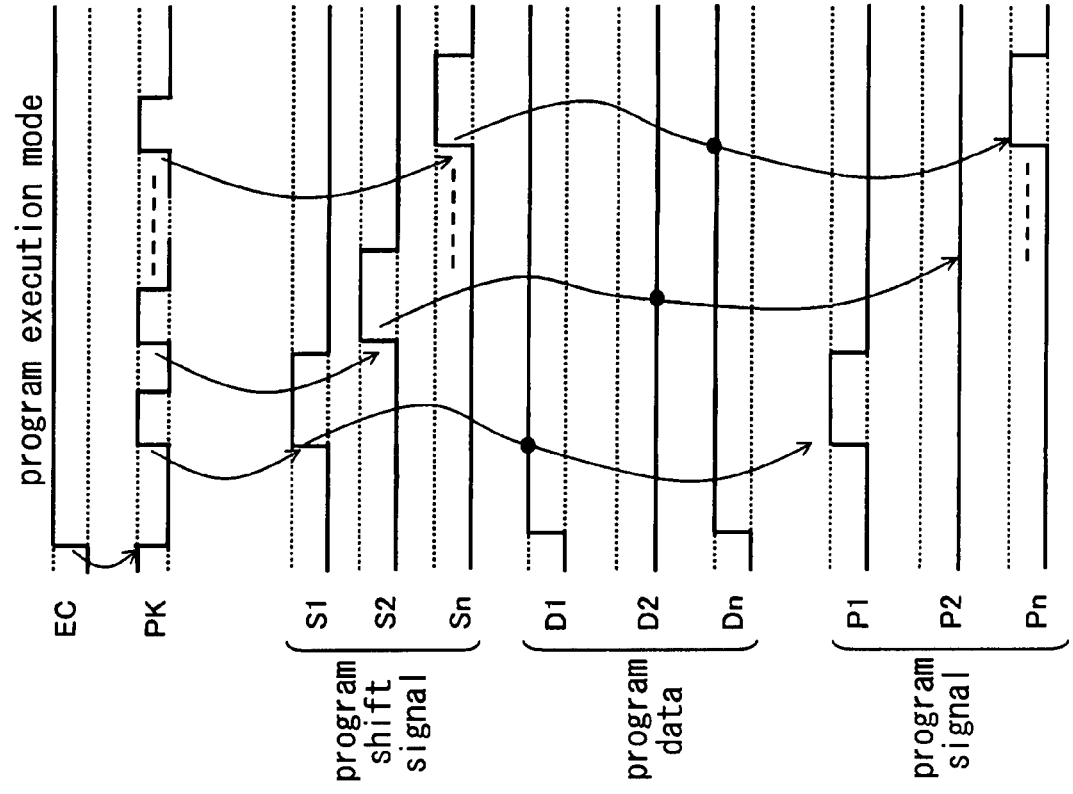

The following explains the operation of the electrical fuse device X1 according to the present embodiment, configured as described above, with reference to the timing charts shown in FIG. 3A and FIG. 3B.

(1) Operation Under Program Execution Mode

In a program execution mode, program data Di, corresponding to a fuse element F whose program execution (blowing, or increasing resistivity) is desired, is set to "H" and program data Di, corresponding to a fuse element F whose the program execution is not desired, is set to "L" and each piece of them is input into one of the input terminals of the AND gate 2.

The program is executable, only when the program clock enable signal EC is in "H", and when the program data Di is in "H", the program signal Pi, output from the AND gate 2, is set to "H" and the switching element Q is turned on, allowing the current to flow through the electrical fuse element F. This executes the program on the electrical fuse element F. On the other hand, when the program data Di is in "L", the program signal Pi, output from the AND gate 2, is set to "L", even when the program shift signal Si is set to "H", thus the switching element Q remains to be "off". As a result, no current flows through the electrical fuse element F and the program is not executed on the electrical fuse element F.

Now, there are assumed to be provided n stages of electrical fuse cores 1. In this configuration and in case that the program is executed and not executed in an alternate manner on electrical fuse cores 1 from the first to nth stage, (D1, D2, . . . ,Dn)=(1,0, . . . ,1) are input as program data. Then the program clock enable signal EC is set to "H" to activate the program clock control circuit 30, so that the program clock signal PK0, from the program clock terminal T1, is ready to be input into the program control circuit 20 as an effective program clock signal PK.

Subsequently, the program control signal PC, being set in the shift register SR in the first stage of the program control circuit 20, is launched from "L" (default) to "H". The timing of the launch is selected so that there is enough time to set up the program control signal PC after the edge of the launch of the effective program signal PK.

In the shift resistor SR in the first stage, the transmission gates 21 and 24 are turned on, during an interval when the effective program clock signal PK is in "L". The transmission gate 21 being turned on allows the program control signal PC in "H" to be input into the shift resistor SR in the first stage. Once the effective clock signal PK is launched from "L" to "H", the transmission gate 21 is turned off. As a result, the program control signal PC ("H") is latched by the inverter 22 and the tri-state type inverter 23. Then, the output of the inverter 22 turns to "L". On the other hand, when the transmission gate 24 is turned on, the program signal S1 and the program control transmission signal A1, both being outputs from the inverter 25, turn to "H". The program control signal PC is turned down to "L", during an interval when the effective clock signal PK is in "H".

After this, when the effective program clock signal PK is turned down from "H" to "L", the transmission gate 21 turns on again and the transmission gate 24 turns off. As a result of the transmission gate 21 turning on, the program control signal PC in "L" is input into the shift resistor SR in the first stage. As a result of the transmission gate 24 turning off, the program control signal PC ("L") is latched by the inverter 25 and the tri-state type inverter 26. Consequently, the program shift signal S1 and the program control transmission signal A1, both being outputs from the inverter 25, are kept in "H" During an interval when the effective signal PK is in "L", the program control transmission signal A1="H" is input into the shift register SR in the second stage.

As described above, for each repetition of periodic clock operation of the program clock signal PK, a program shift signal Si (i=1 to n) is sequentially generated as a pulse signal, having a pulse width equal to one cycle of the effective program clock signal PK, and, in a similar manner, a program control transmission signal Ai (i=1 to n) is transmitted sequentially to the shift register SR in the next stage.

When a pulse signal of the program shift signal Si is input into the AND gate 2 of the program control circuit 20, the program becomes executable, as described previously, and the output status of the AND gate 2 is determined according to the program data (D1,D2, ... ,Dn)=(1,0, ... ,1), in synchronization with the launching edges of the effective program clock signal PK. In FIG. 3, the program signal P1 is set to "H" and the switching element Q turns on only during the interval equal to the width of the pulse, allowing the program to be executed on the fuse element in the first stage. On the other hand, the program signal P2 is set to "L" and the switching element Q turns off, not allowing the fuse element program in the second stage to be executed. The program signal Pn, in the similar manner as the program signal P1, allows the fuse element program in the $n^{th}$ stage to be executed.

(2) Operation Under Program Non-Execution Mode

In a program non-execution mode, the program clock enable signal EC is kept to "L". As a result, the effective program clock signal PK, or the output from the program clock control circuit 30, is fixed to "H." Consequently, the program shift signal Si is put into a negated state and the program is not executed.

As described, in the present embodiment, there is provided an additional program clock control circuit 30 and the program clock signal PK0 from the program control clock terminal T1 is controlled by the program enable signal EC from the program clock terminal T2. As a result, in a program non-execution mode, the effective program clock signal PK is logically blocked completely.

The electrical fuse device X1 in the present embodiment, when installed with a system LSI, does not erroneously execute the program on the fuse elements F, even in case that pulses, under the influence of noise, surge or the like, are generated on the external terminals. Therefore, according to the present embodiments, electrical fuse devices with high reliabilities are provided.

Incidentally, the component of the program clock control 30 is not limited to a NAND gate, but other circuits, e.g., NOR circuit, may be used, as far as they are capable of controlling the effective program clock signal PK.

Second Embodiment

In the first embodiment described above, the following disadvantage may still exist. In a program non-execution mode, the program enable signal EC is set to a negated state, or "L"; however, there still remains a chance that, in case that a pulse is erroneously generated by noise, surge or the like on the external terminal T1 and/or T2, the pulse may, as an asserted program enable signal EC, be input into the program clock control circuit 30. In such a case, there may be a slime chance that the program is erroneously executed on the electrical fuse element F in a program non-execution mode. A second embodiment of the present invention is implemented, taking this disadvantage into consideration.

Figure 4:
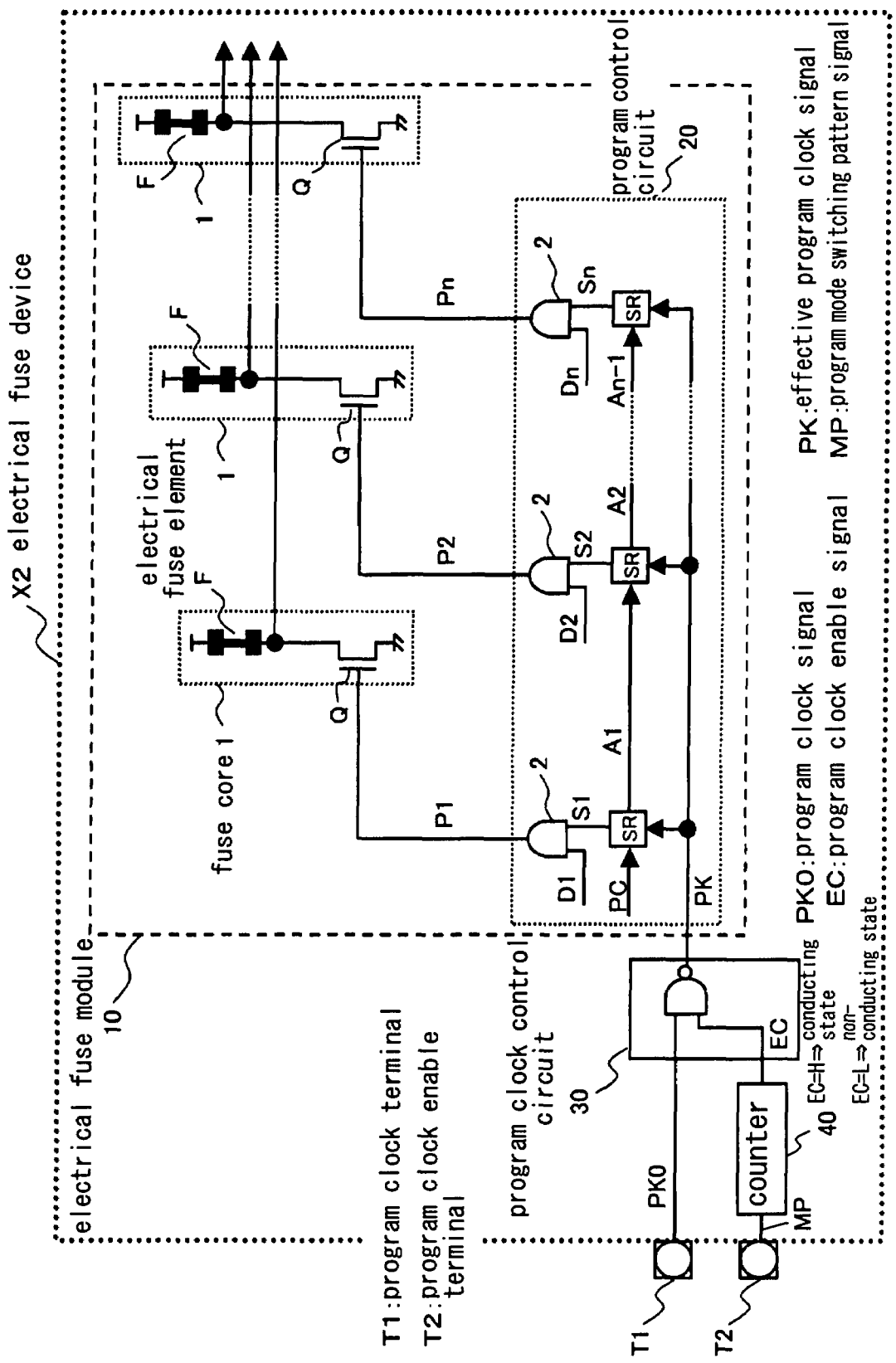
FIG. 4 is a circuit diagram showing a configuration of an electrical fuse device according to a second embodiment.

FIG. 4 is a circuit diagram showing a configuration of the electrical fuse device X2 according to the second embodiment. Incidentally, the same elements as used in FIG. 1 are denoted by the same reference numerals. In FIG. 4, the reference numeral 40 is a counter circuit which is installed between the program clock enable terminal T2 and the NAND gate of the program clock control circuit 30. The counter circuit 40 counts the number of the input pulses of a program mode switching pattern signal MP, and, when the number counted reaches a preset number, asserts and outputs the program enable signal EC to the program clock control circuit 30. The present embodiment is featured by the counter circuit 40 installed. The rest of the configurations are the same as those in the first embodiment, and their explanations are omitted.

FIG. 5 is an example of the circuit diagram showing a configuration of the counter circuit 40 in FIG. 4. In FIG. 5, the reference numeral 41 is a D-flip-flop, and there are five D-flip-flops 41 connected in a series. The D-flip-flop 41 in the first stage has a data input connected to a power source and the data input in the next stage is connected to the data output in the previous stage. The program mode switching pattern signal MP, input from the program clock enable terminal T2, is commonly input into the clock input terminals of all the D-flip-flops 41.

Figure 6:
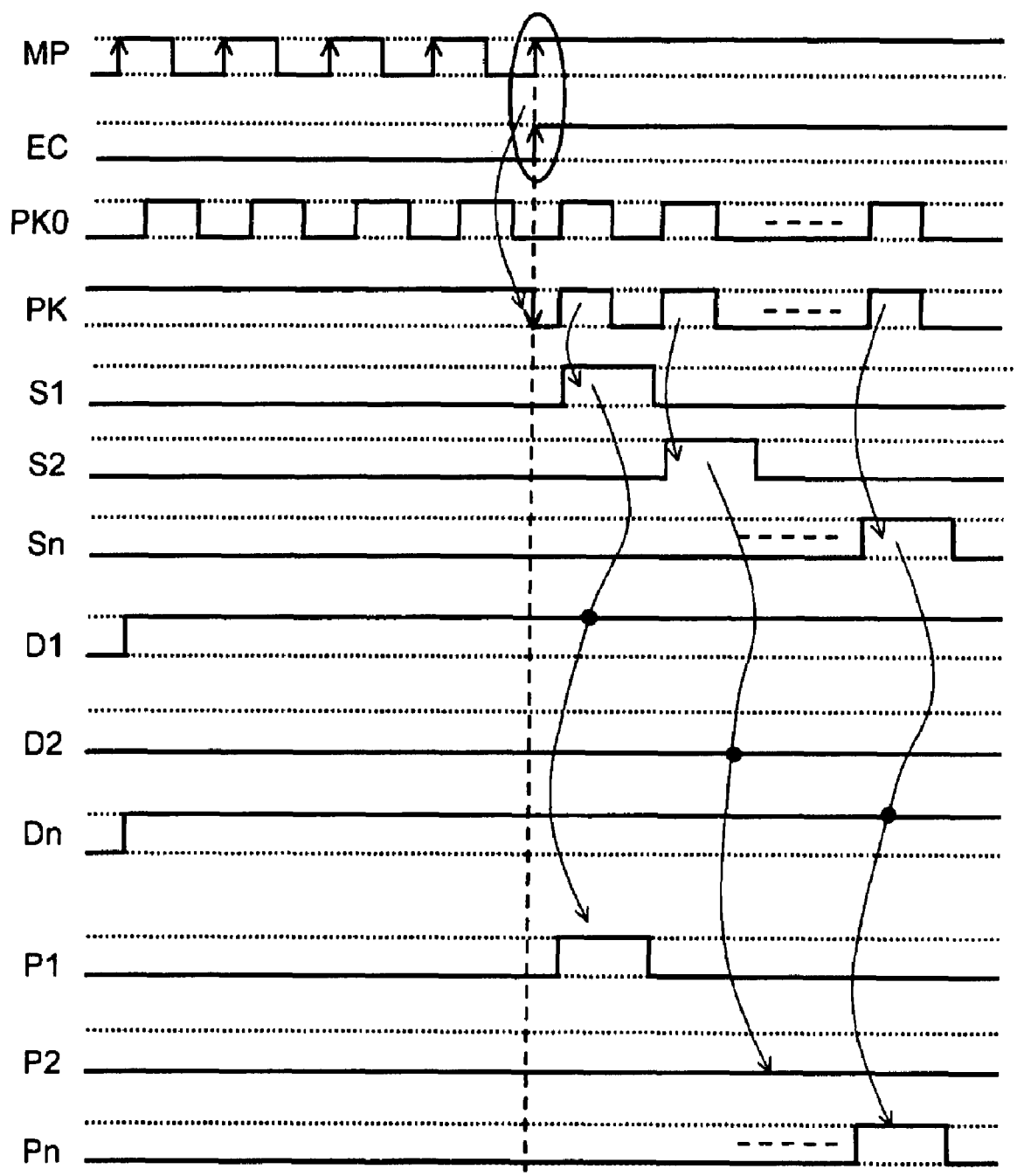
FIG. 6 is a timing chart showing the operations of the electrical fuse device according to the second embodiment.

The following explains the operation of the electrical fuse device X2, configured as described above, with reference to the timing charts shown in FIG. 6.

(1) Operation Under Program Execution Mode

In a program execution mode, a program mode switching pattern signal MP is input into the program clock enable terminal T2. Here, the program mode switching pattern signal MP, being brought into correspondence with the counter circuit 40 shown in FIG. 5, is assumed to have a pattern, in which the signal is fixed to "H" after four clocks. When the program mode switching pattern signal MP is input from the program clock enable terminal T2, the counter circuit 40 outputs a program clock enable signal EC which is asserted "H" at a launch timing after the four clocks. As a result, the program clock control circuit 30 is put into an active state, allowing the program clock signal PK0 from the program clock terminal T1 to pass through the program clock control circuit 30. Consequently, the program clock signal PK0 becomes ready to be input into the shift register SR of the program control circuit 20, as an effective program clock signal PK. The rest of the operation is the same as in the first embodiments and the explanations are omitted.

(2) Operation Under Program Non-Execution Mode

In a program non-execution mode, no program mode switching pattern signal MP, having any preset pattern, is input into the counter circuit 40. As a result, the program clock control circuit 30 remains inactive and no effective program clock signal PK is forwarded to the program control circuit 20. Therefore, the program is not executed on the fuse core 1 at all. As a result, when asserting the program clock enable signal EC, any influence by noise, surge or the like is excluded more assuredly. The fuse element program is thus prevented, in a more reliable manner, from being erroneously executed.

As described, according to the present embodiment, in a program non-execution mode, unless the counter circuit 40 inputs a program mode switching pattern signal MP with a preset pattern from the program clock enable terminal T2, the program clock control circuit 30 remains disabled and logically blocks the effective program clock signal PK completely. As a result, even in case that pulses, under the influence of noise, surge or the like, may erroneously generated on the program clock terminal T1 and/or program clock enable terminal T2, their pattern at the program clock enable terminal T2 is different from the program mode switching pattern signal MP and, consequently, the program clock enable signal EC should never be asserted unexpectedly. In addition, because settings of many terminals are required at the time of inspections, the "H" fix or "L" fix settings, which is made according to the status of the external terminals T1 and T2, may be incorrectly made, but, even in such cases, the program clock enable signal EC is not asserted unexpectedly. According to the present embodiment, in a program non-execution mode, the program of the electrical fuse element F is not caused to be executed erroneously and, as a result, more reliable electrical fuse devices are provided.

Incidentally, the counter circuit 40 is not limited to the configuration having plural stages of D-flip-flops 41, but any counter circuit having a similar function may be used.

Third Embodiment

In a third embodiment of the present invention, an output in an "H" level, from the fuse core 1 in the final stage in a program non-execution mode, of a plurality of fuse cores 1, is used also as the program clock enable signal EC. The program control circuit 20, having shift resisters SR, executes the program for each of the plurality of fuse cores 1, sequentially from the first stage. Because of this, regardless of whether the program of the fuse core 1 in the final stage is executed or not, the fuse core 1 in the final stage remains unexecuted until the end of a program execution mode, with its output level kept in "H". The present embodiment is featured by the utilization of the output from the fuse core 1 in the final stage in "H" level as the program clock enable signal EC.

Figure 7:
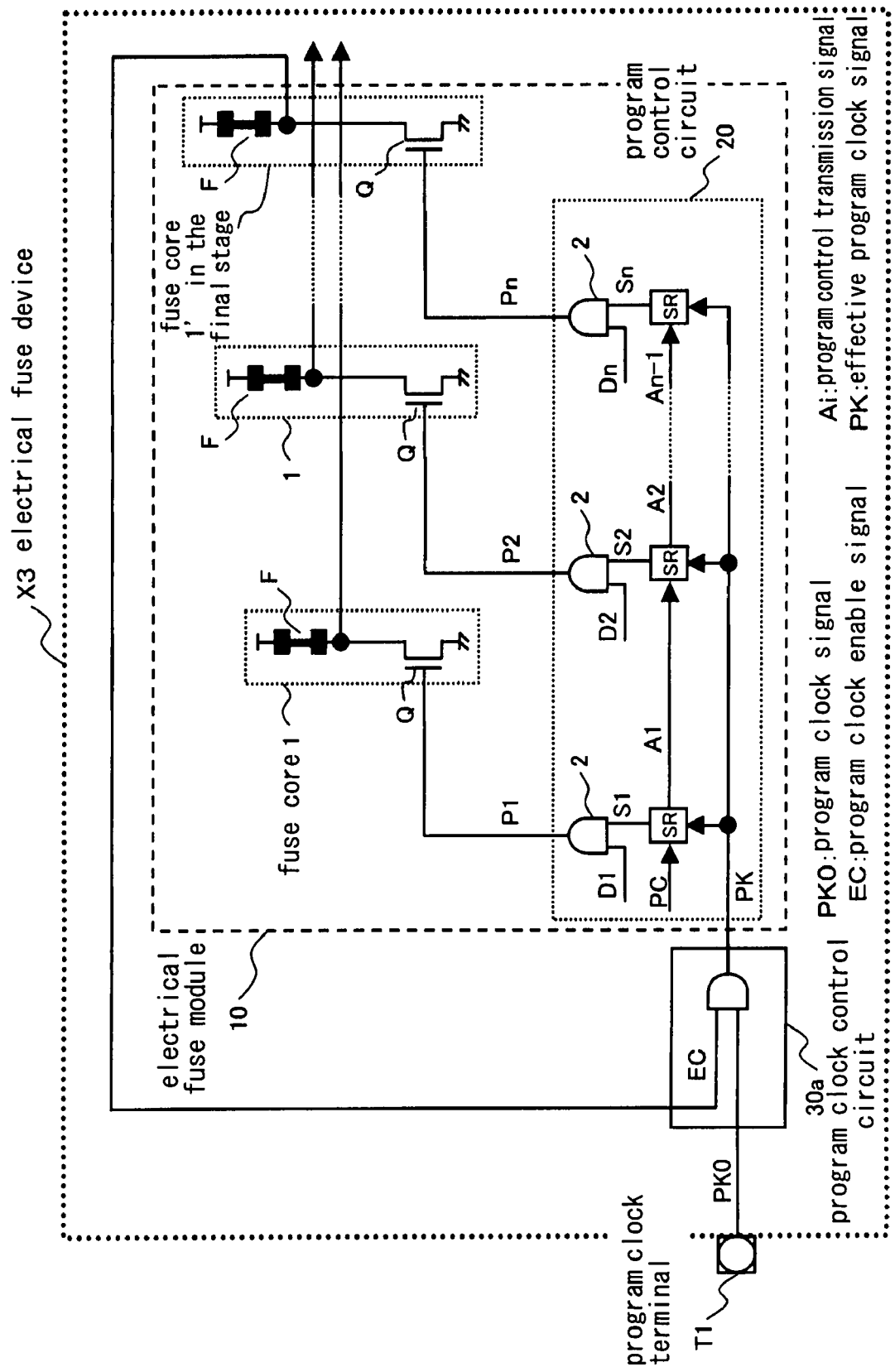
FIG. 7 is a circuit diagram showing a configuration of an electrical fuse device according to a third embodiment.

FIG. 7 is a circuit diagram showing a configuration of the electrical fuse device X3 according to the third embodiment. The same elements as used in FIG. 1 are denoted by the same reference numerals. In FIG. 7, the reference numeral 1' denotes the fuse core in the final stage. The reference numeral 30a is a program clock control circuit comprising a two-input AND gate (not a NAND gate). The contact, between the fuse element F, in the final stage fuse core 1', and the switching element Q, is connected to one input of the AND gate of the program clock control circuit 30a and the other input is connected to the program clock terminal T1. The rest of the configurations are the same as in the first embodiment, and their explanations are omitted.

Figure 8:
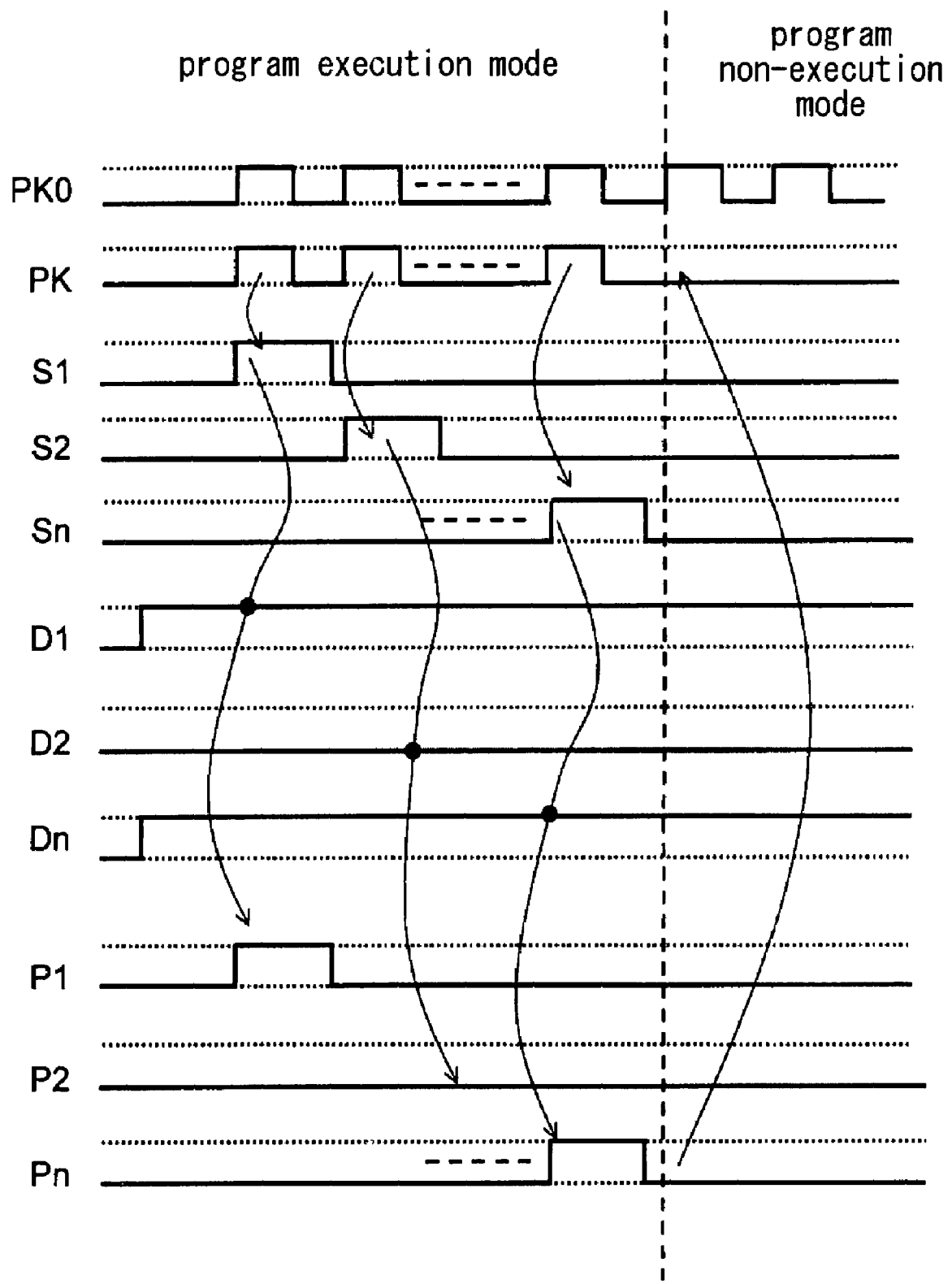
FIG. 8 is a timing chart showing the operations of the electrical fuse device according to the third embodiment.

The following explains the operation of the electrical fuse device X3, according to a present embodiment configured as described above, with reference to the timing chart shown in FIG. 8. In the initial program execution mode, the electrical fuse element F of the final stage fuse core 1' is in a non-execution state and the output from the fuse element F in the final stage is "H", which is input into the AND gate of the program clock control circuit 30a. As a result, the program clock control circuit 30a passes the program clock signal PK0, an input from the program clock terminal T1, through and the program clock signal PK0 is provided to the program control circuit 20 as an effective program clock signal PK. As a result, the configuration operates in the same manner as the first embodiments. After the program for all the fuse cores 1, other than the fuse core 1' in the final stage, is executed in a desired manner, the program on the fuse core 1' in the final stage is executed. When the program is executed on the fuse element F in the final stage, the output from the electrical fuse element F turns from "H" to "L." As a result of the turn, the effective program clock signal PK, or the output from the program clock control circuit 30a, is fixed to "L." As a result, the program control circuit 20 is disabled and any subsequent execution of the program is prohibited.

As described, according to the present embodiment, the output in "H", from the electrical fuse element F in the final stage, is used as a program clock enable signal EC to enable the effective program clock signal PK to be logically blocked completely and, thus, to prevent erroneous overwriting by false operations after desired execution of the program. In addition, because the need for the program clock enable terminal T2 which is required in the case of the first embodiment to input the program clock enable signal EC externally is eliminated, the circuit configuration is simplified. Incidentally, the present embodiment has the same effect as the first and second embodiments, and provides a highly reliable electrical fuse device.

Fourth Embodiment

Figure 9:
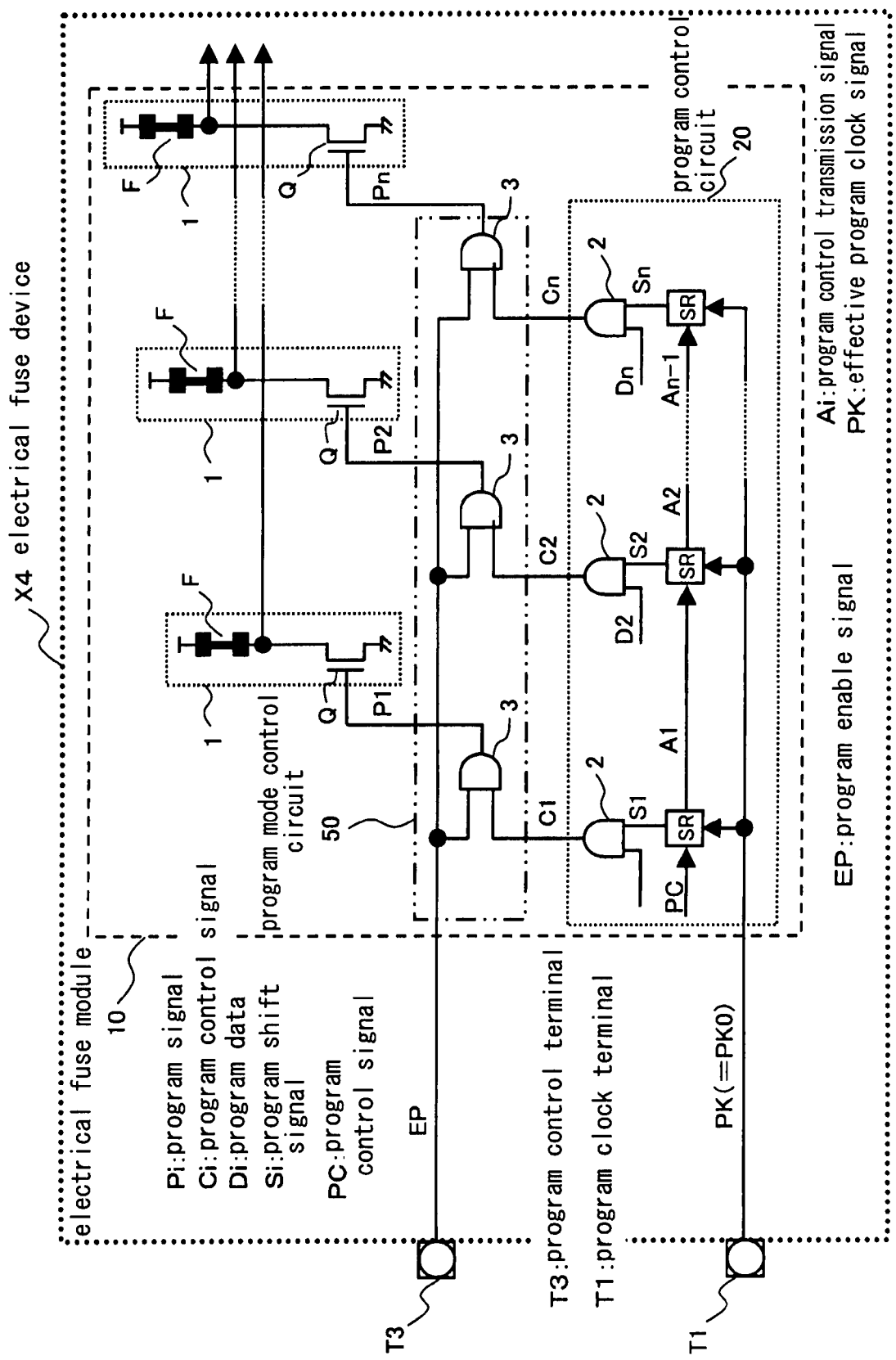
FIG. 9 is a circuit diagram showing a configuration of an electrical fuse device according to a fourth embodiment.

FIG. 9 is a circuit diagram showing a configuration of the electrical fuse device X4 according to a fourth embodiment. In FIG. 9, the reference symbol T3 denotes a program control terminal, controlling the execution/non-execution of the program on all of the plurality of fuse cores 1, the reference numeral 50 denotes a program mode control circuit and the reference numeral 3 denotes an AND gate.

In the first embodiment described previously, a program control circuit 30, controlling effective program clock signals PK, is installed in a stage before the program control circuit 20; however, in the present embodiment, instead of installing the program control circuit 30, a program mode control circuit 50 is installed in a stage after the program control circuit 20. The program mode control circuit 50 is installed between the program control circuit 20 and the group of the fuse cores 1. The program mode control circuit 50 comprises a plurality of AND gates 3. The program control signals Ci (i=1 to n), from the AND gate 2 of the program control circuit 20, and a program enable signal EP, from the program control terminal T3, are input into the AND gates 3. The AND gates as many as the number (n) of stages of the fuse cores 1 are installed.

The program mode control circuit 50 controls the conducting and non-conducting states of the program control signals Ci from the program control circuit 20, based on the program enable signal EP. The program mode control circuit 50 outputs the conducted program control signal Ci, to each of the switching elements Q of the plurality of fuse cores 1, as a program signal Pi. The rest of the configuration is the same as in the case of the first embodiments shown in FIG. 1, the same elements are denoted by the same reference numerals, and the detailed explanations of which are omitted.

Figure 10A:
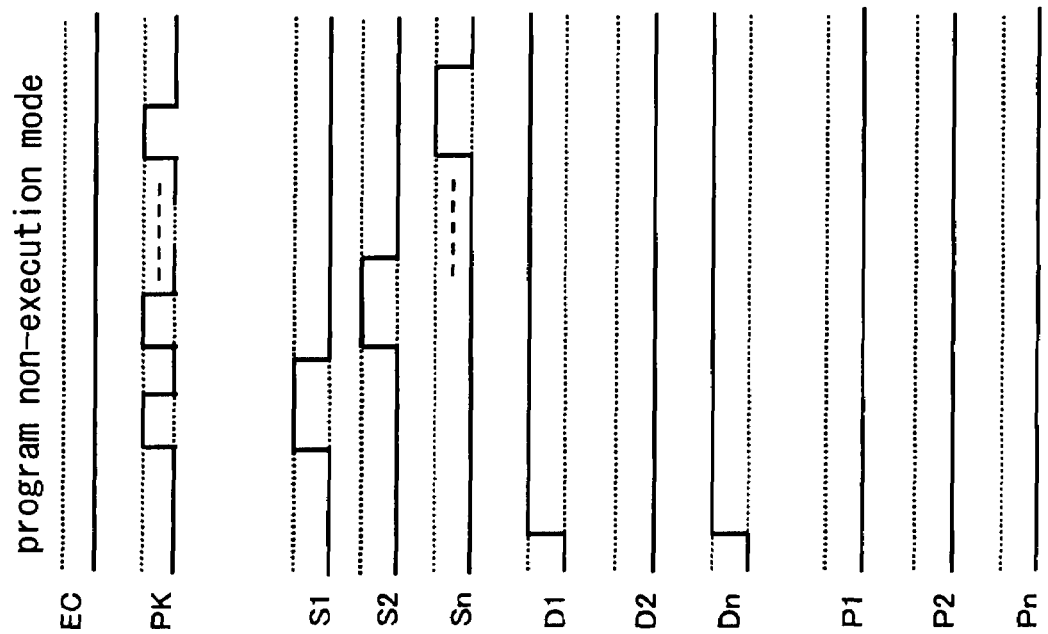
FIG. 10A and FIG. 10B are timing charts showing operations of the electrical fuse device according to the fourth embodiment.
Figure 10B:
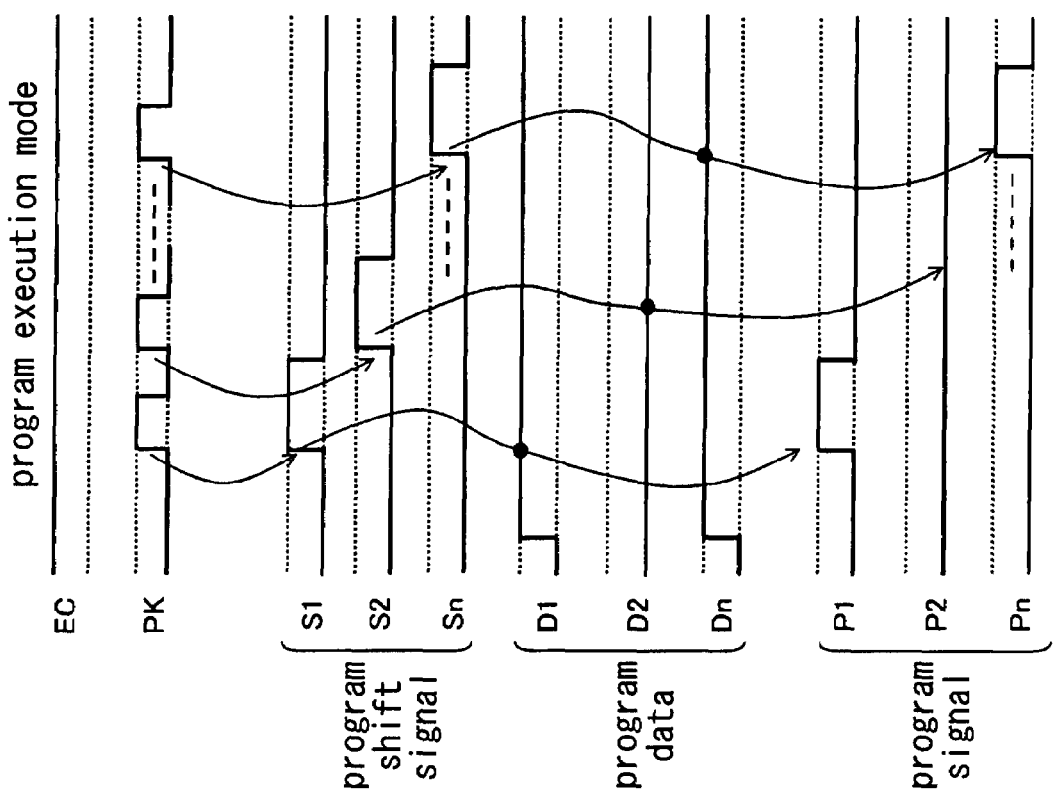

The following explains the operation of the electrical fuse device X4, according to the present embodiments configured as described above, with reference to the timing charts shown in FIG. 10A and FIG. 10B.

(1) Operation Under Program Execution Mode

When programming a fuse element F, "H" data is first input into the program control terminal T3 as a program enable signal EP, and the "H" data is input into one of the input terminals of the AND gates 3 of the program mode control circuit 50. After this, program data Di are input into respective AND gates 2 of the program control circuit 20.

Subsequently, an effective program clock signal PK (program clock signal PK0) is input from the program clock terminal T1. As a result, as in the case of the first embodiment, a program control signal Ci corresponding to the program data Di is output sequentially from each AND gate 2 of the program control circuit 20 to the program mode control circuit 50. As a result, from each AND gate 3, in a conducting state, of the program control circuit 50, a program signal Pi corresponding to the program data Di is output sequentially, to be applied on the switching element Q of each fuse core 1. As a result, the program is executed on the electrical fuse element F.

(2) Operation Under Program Non-Execution Mode

In a program non-execution mode, the program enable signal EP at the program control terminal T3 is first fixed to "L", making all the AND gates 3, in the program mode control circuit 50, in non-conducting state. As a result, the AND gates 3 keeps outputting a signal fixed to "L", whichever program control signal Ci is input, keeping all the switching elements Q off.

According to the present embodiments, only through the control by the program enable signal EP at the program control terminal T3, the program for all the fuse cores 1 are controlled and, consequently, even in case that pulses, under the influence of noise, surge or the like, are generated on the program clock terminal T1, the program on the electrical fuse F is not executed erroneously, in a program non-execution mode, and thus a reliable electrical fuse device is provided.

Fifth Embodiment

Figure 11:
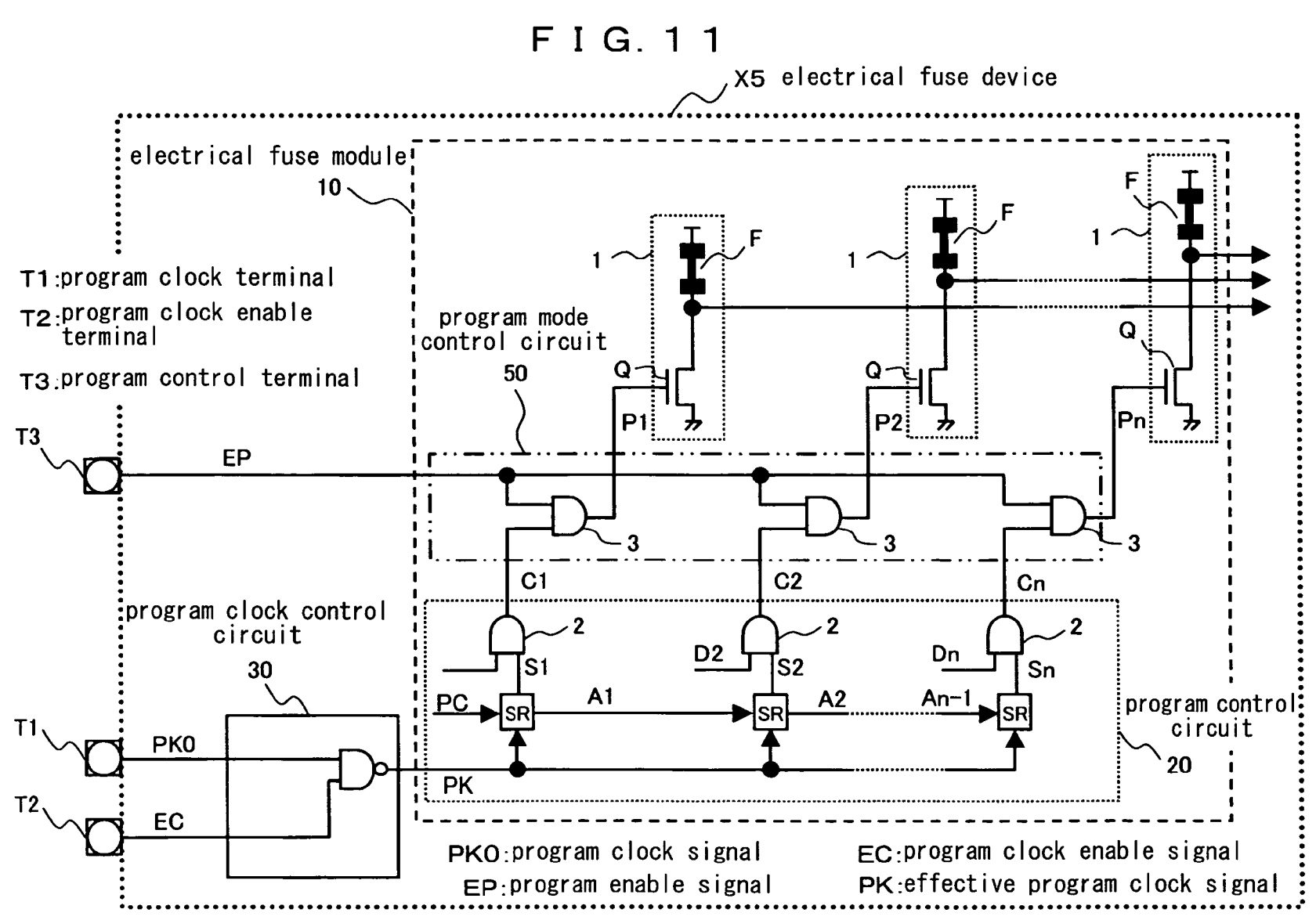

A fifth embodiment of the present invention is a hybrid of the configuration of the fourth embodiment shown in FIG. 9, described previously, and the configuration of the first embodiment shown in FIG. 1. FIG. 11 is a circuit diagram showing a configuration of the electrical fuse device X5 according to the fifth embodiment. Incidentally, the same elements as used in FIG. 1 and FIG. 9 are denoted by the same reference numerals. In the present embodiment, there are provided, two erroneous program preventative elements, i.e., the program clock control circuit 30 and program mode control circuit 50.

The following explains the operation of the electrical fuse device X5 according to the present embodiment configured as described above, with reference to the timing charts shown in FIG. 12A and FIG. 12B.

(1) Operation Under Program Execution Mode

When executing the program on an electrical fuse element F, "H" data is first input into the program control terminal T3 as a program enable signal EP and "H" data is also input into the program clock enable terminal T2 as a program clock enable signal EC. As a result, the program clock signal PK0 from the program clock terminal T1 passes through the program clock control circuit 30. Consequently, the program clock signal PK0 is provided to the program control circuit 20 as an effective program clock signal PK. Because all the AND gates 3 in the program mode control circuit 50 are in a conducting state at this time, the fuse cores 1 are sequentially programed, as in the case the first embodiments.

(2) Operation Under Program Non-Execution Mode

In a program non-execution mode, as in the case of the fourth embodiment, the program enable signal EP, at the program control terminal T3, is first fixed to "L", to make all the AND gates 3, in the program mode control circuit 50, in a non-conducting state, and to fix the program clock enable signal EC, from the program enable terminal T2, to "L". As a result, the AND gates 3 keeps outputting a signal fixed to "L", whichever program control signal Ci is input keeping the switching elements Q off.

In this configuration, even in case that the program control terminal T3 is erroneously set to be fixed to "H", or to a program execution mode, by a setting error, the program clock enable signal EC at the program clock enable terminal T2 is fixed to "L" to make the program control circuit 30 disabled, keeping the effective program clock signal PK negated, and the program on the electrical fuse element F is not executed.

Thus, according to the present embodiment, both the program clock control circuit 30 and the program mode control circuit 50 function as a dual system for the prevention against erroneous executions of the program and, in a program non-execution mode, even in case that the program clock terminal T1 and/or program control terminal T3 are (is) set erroneously, by setting errors, to a program execution mode, the program is not executed erroneously on the electrical fuse element F. Therefore, the configuration further improves reliability against influences of noise, surge or the like.

Sixth Embodiment

Figure 13:
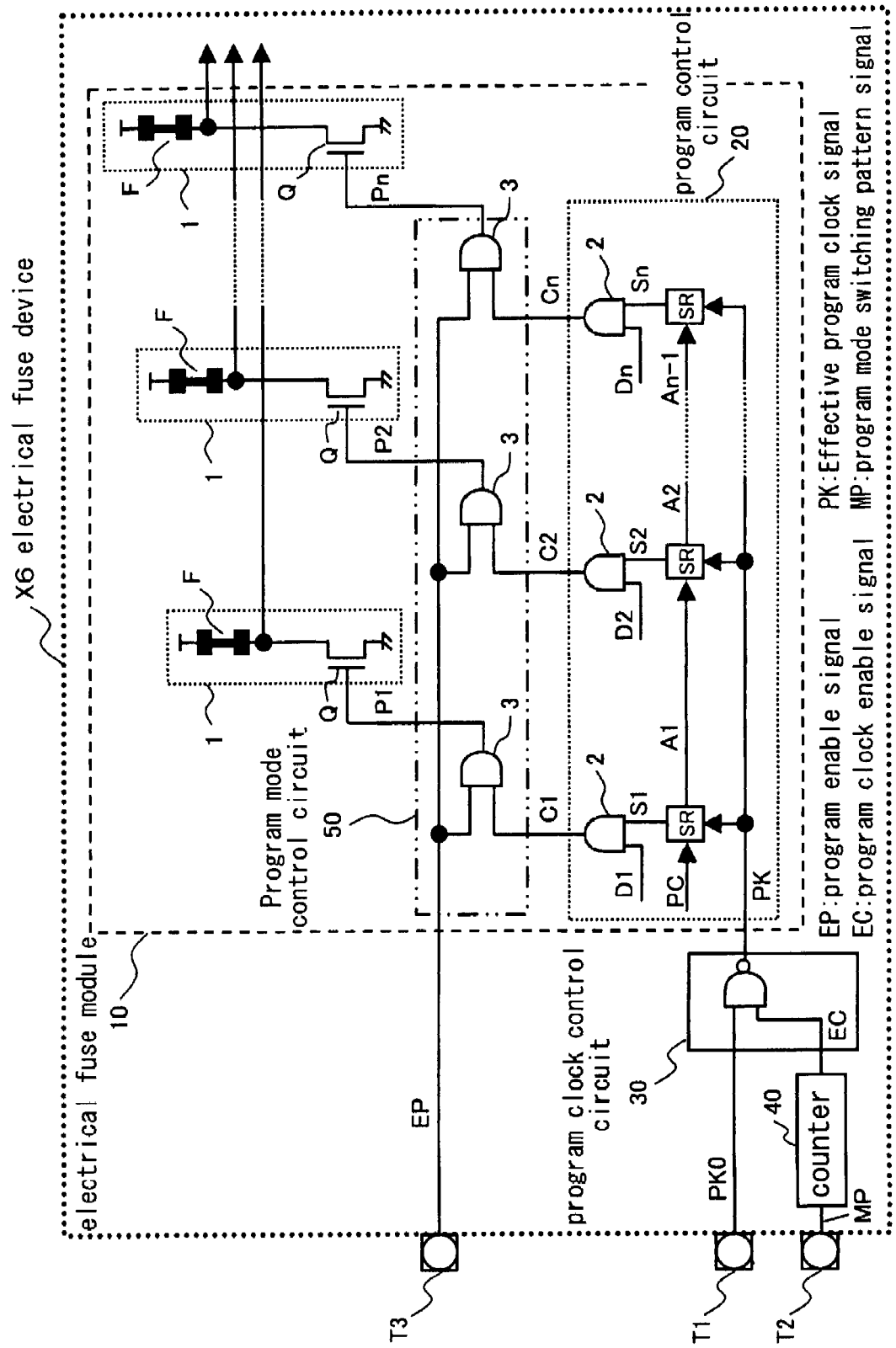
FIG. 13 is a circuit diagram showing a configuration of an electrical fuse device according to a sixth embodiment.

A sixth embodiment of the present invention is a hybrid of the configuration of the fifth embodiment shown in FIG. 11 and the configuration of the second embodiment shown in FIG. 4. FIG. 13 is a circuit diagram showing a configuration of the electrical fuse device X6 according to the sixth embodiment. Incidentally, the same elements as used in FIG. 4 and FIG. 11 are denoted by the same reference numerals. In the present embodiment, there are provided three erroneous program execution preventative elements, i.e., a program clock control circuit 30, counter circuit 40 and program mode control circuit 50.

The following explains the operation of the electrical fuse device X6 configured as described above, with reference to the timing charts shown in FIG. 14.

(1) Operation Under Program Execution Mode

When executing the program on an electrical fuse element F, "H" data is first input into the program control terminal T3 as a program enable signal EP and a program mode switching pattern signal MP is input into the program clock enable terminal T2. As a result, in a similar manner as in the second embodiment, the program is sequentially executed on each electrical fuse element F of the fuse cores 1, in accordance with the program data Di.

(2) Operation Under Program Non-Execution Mode

In a program non-execution mode, in a similar manner as in the fourth embodiment, the program enable signal EP at the program control terminal T3 is first fixed to "L", making all the AND gates 3, in the program mode control circuit 50, in non-conducting state, and no program mode switching pattern signal MP with a preset pattern is input into the counter circuit 40. As a result, the AND gates 3 is kept being fixed to "L", whichever program control signal Ci is input, keeping all the switching elements Q off.

In this configuration, even in case that the program control terminal T3 is erroneously fixed to "H", or to a program execution mode, by a setting error, unless a program mode switching pattern signal MP with a preset pattern is input into the program clock enable terminal T2 in a program non-execution mode, the counter circuit 40 keeps the program clock control circuit 30 in a disabled state. Therefore, the effective program clock signal PK is logically blocked completely. As a result, even in case that pulses, under the influence of noise, surge or the like, may erroneously be generated on the program clock terminal T1 and program clock enable terminal T2, the pattern at the program clock enable terminal T2 is different from the program mode switching pattern signal MP and the program enable signal EC is not asserted unexpectedly. In addition, even in case that the setting of "H" fixed/"L" fixed, according to the status of the external terminals T1 and T2, is erroneously made during inspections, the program enable signal EC is not asserted unexpectedly.

As described, according to the present embodiment, the program clock control circuit 30, counter circuit 40 and program mode control circuit 50 function as a triple system to prevent erroneous execution of the program, and, even in case that the program clock terminal T1, program clock enable terminal T2 and/or program control terminal T3, in a program non-execution mode, are (is) set erroneously to a program execution mode, the program is not executed on the electrical fuse element F erroneously. As a result, according to the present embodiment, the reliability against noise, surge or the like is further improved.

Seventh Embodiment

Figure 15:
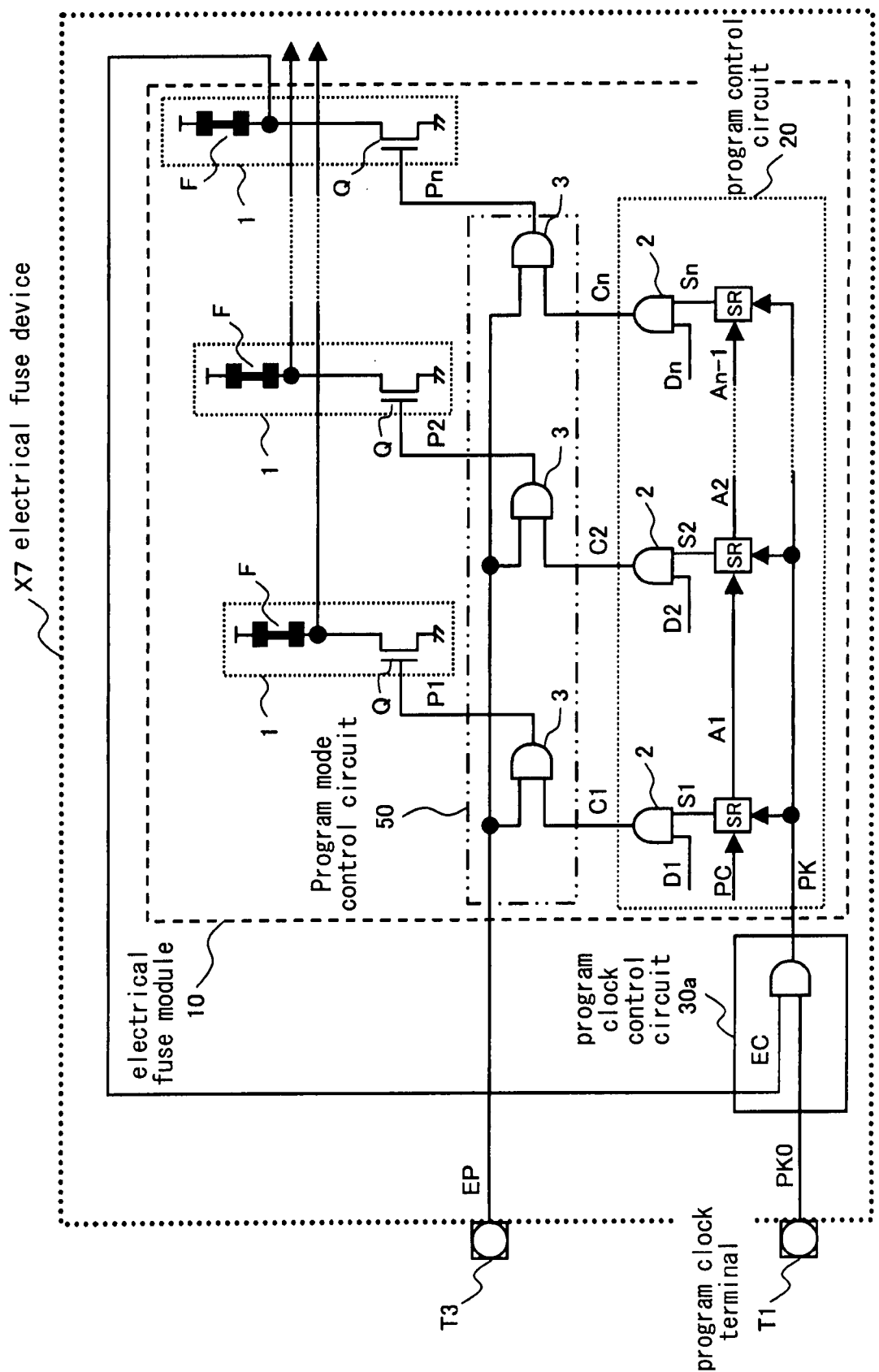
FIG. 15 is a circuit diagram showing a configuration of an electrical fuse device according to a seventh embodiment.

A seventh embodiment, according to the present invention, is a hybrid of the configuration of the fourth embodiment shown in FIG. 9 and the configuration of the third embodiment shown in FIG. 7, described previously. FIG. 15 is a circuit diagram showing a configuration of the electrical fuse device X7 according to the seventh embodiment. The same elements as used in FIG. 7 and FIG. 9 are denoted by the same reference numerals. In the present embodiment, as erroneous program preventative elements, there are provided the program clock control circuit 30a and the program mode control circuit 50, and an output in "H" level from the fuse core 1 in a non-programmable state, in the final stage of a plurality of fuse cores 1, is also used as the program clock enable signal EC of the program clock control circuit 30a.

Figure 16:
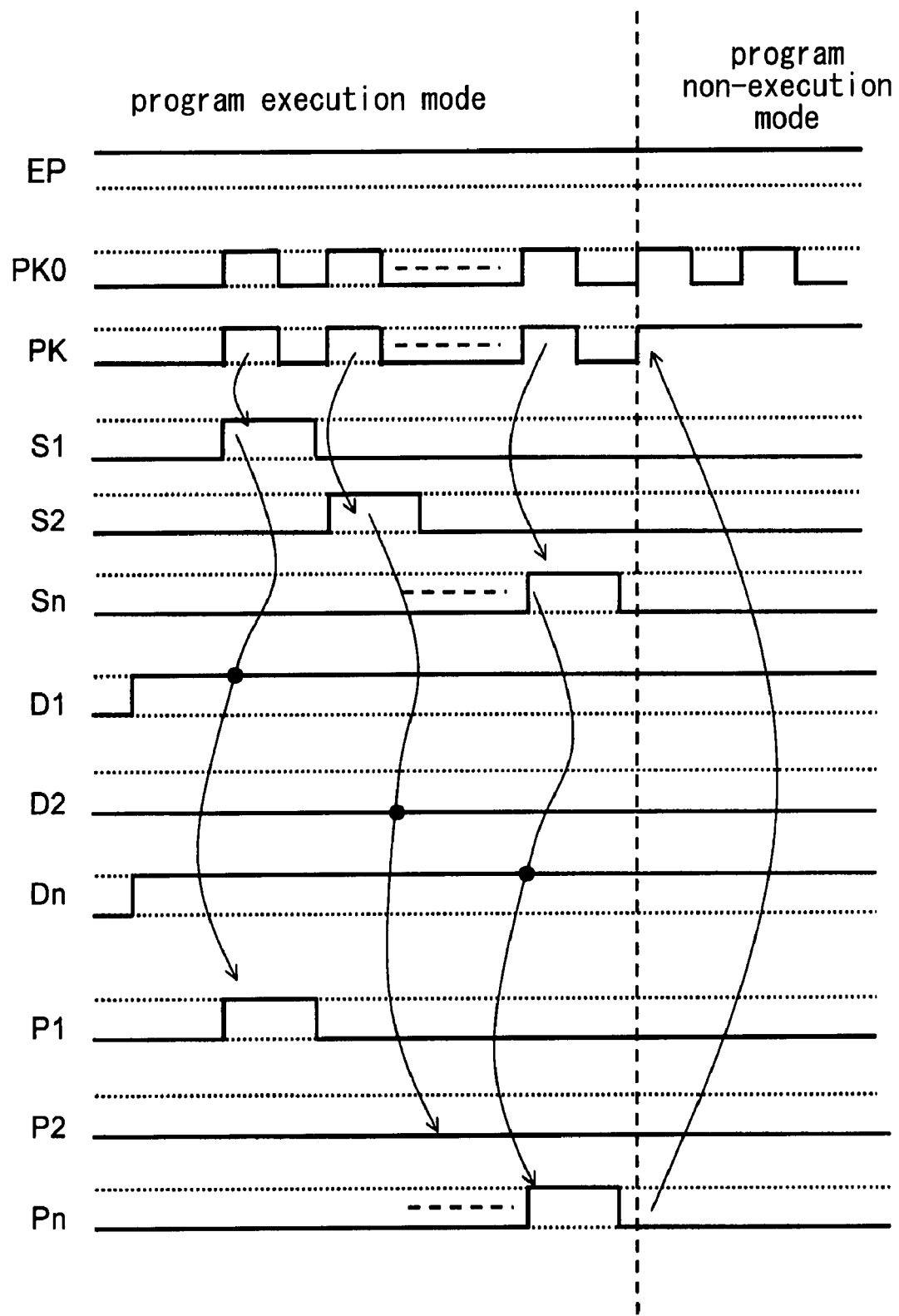
FIG. 16 is a timing chart showing the operations of the electrical fuse device according to the seventh embodiment.
Figure 17:
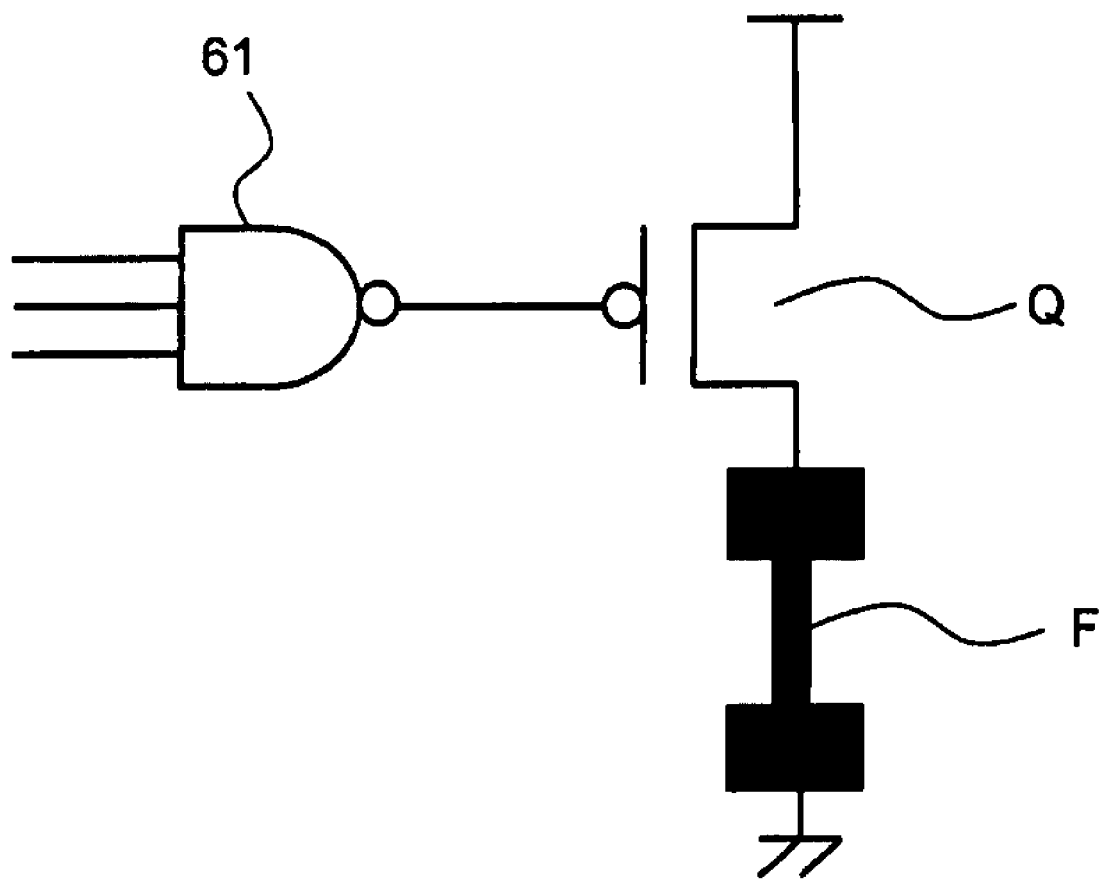
FIG. 17 is a circuit diagram showing a configuration of a conventional electrical fuse device.

The following explains the operation of the electrical fuse device X7, configured as described above, with reference to the timing charts shown in FIG. 16.

(1) Operation Under Program Execution Mode

The program enable signal EP from the program control terminal T3 is asserted, and the output in "H" from the electrical fuse element F of the fuse core 1' in the final stage is input into the program clock control circuit 30a, as a program clock enable signal EC to the program clock control circuit 30a comprising an AND gate. As a result, the program clock signal PK0 from the program clock terminal T1 passes through the program clock control circuit 30a and the program clock signal PK0 is provided to the program control circuit 20 as an effective program clock signal PK. As a result, as in the cases of the other embodiments described previously, the program is executed on each of the electrical fuse elements F, in accordance with the program data Di.

After the program is executed in a desired manner on each of fuse cores 1, other than the fuse core 1' in the final stage, the program is executed on the core 1' in the final stage. Thus, when the program is executed on the electrical fuse element F in the final stage, the output from the electrical fuse element F turns from "H" to "L". As a result of the output turning of the electrical fuse element F in the final stage, the effective program clock signal PK, the output from the program clock control circuit 30a, is fixed to "L". As a result, the program control circuit 20 is disabled and prohibits any subsequent execution of the program.

(2) Operation Under Program Non-Execution Mode

In a program non-execution mode, the program enable signal EP from the program control terminal T3 is negated, and all the AND gates 3, in the program mode control circuit 50, are set to non-conducting states. In addition, because the program clock enable signal EC is fixed to "L", the program clock signal PK is negated.

As a result, even in case that the program control terminal T3 and the program clock terminal T1 are both fixed erroneously by a setting error to "H" in a program non-execution mode, after the program is executed on the electrical fuse element F in the final stage and the output of the electrical fuse element F of the final stage is fixed to "L", the program clock control circuit 30a remains disabled. As a result, from then on, the program is not executed on any of the fuse cores 1.

Thus, according to the present embodiment, the program clock control circuit 30a and the program mode control circuit 50 function as a dual system to prevent erroneous execution of the program and, in a program non-execution mode, even in case that the program clock terminal T1 and/or program control terminal T3 are (is) erroneously set into a program execution mode, the program is not executed erroneously on the electrical fuse element F. Therefore, reliabilities against influence of noise, surge or the like are further improved.

In addition, the need for the program clock enable terminal T2 which externally inputs the program clock enable signal EC is eliminated and, consequently, the circuit configuration is simplified While preferred embodiments of the present invention have been described in detail, it should be apparent that combinations and arrangements of elements, in the preferred embodiments, are able to be modified, or changed, without violating the spirit and scope of the present invention, limited only by the following claims.

What is claimed is:

1. An electrical fuse device comprising:
  a plurality of fuse cores, each having an electrical fuse element and a switching element serially connected to the electrical fuse element;
  a program control circuit for generating a program shift signal by sequentially shifting a program control transmission signal in synchronization with an effective program clock signal and subsequently generating a program signal to be provided to each of the switching elements in the plurality of fuse cores based on program data and the program shift signal;
  a program clock control circuit for controlling the conducting and non-conducting states of a program clock signal in accordance with a program clock enable signal and, when the program clock signal is in a conducting state, transmitting the program clock signal to the program control circuit as the effective program clock signal; and
  a counter circuit, disposed in a stage before the program clock control circuit, for counting the number of input pulses of a program mode switching pattern signal, asserting and outputting the program clock enable signal to the program clock control circuit, when the number of the input pulses counted reaches a preset value.

2. An electrical fuse device comprising:
  a plurality of fuse cores, each having an electrical fuse element and a switching element serially connected to the electrical fuse element;
  a program control circuit for generating a program shift signal by sequentially shifting a program control transmission signal in synchronization with an effective program clock signal and subsequently generating a program control signal based on program data and the program shift signal;

a program mode control circuit for controlling the conducting and non-conducting states of the program control signal in accordance with a program enable signal and, when the program control signal is in a conducting state, outputting the program control signal to each of the switching elements in the plurality of fuse cores as a program signal;

a program clock control circuit for controlling the conducting and non-conducting states of a program clock signal in accordance with a program clock enable signal and, when the program clock signal is in a conducting state, transmitting the program clock signal to the program control circuit as the effective program clock signal; and a counter circuit, disposed in a stage before the program clock control circuit, for counting the number of input pulses of a program mode switching pattern signal, asserting and outputting the program clock enable signal to the program clock control circuit when the number of the input pulses counted reaches a preset value.

* * * * *